US009917186B2

(12) United States Patent
Laven et al.

(10) Patent No.: US 9,917,186 B2
(45) Date of Patent: *Mar. 13, 2018

(54) SEMICONDUCTOR DEVICE WITH CONTROL STRUCTURE INCLUDING BURIED PORTIONS AND METHOD OF MANUFACTURING

(71) Applicant: Infineon Technologies AG, Neubiberg (DE)

(72) Inventors: Johannes Laven, Taufkirchen (DE); Hans-Joachim Schulze, Taufkirchen (DE); Matteo Dainese, Villach (AT); Peter Lechner, Holzkirchen (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/394,303

(22) Filed: Dec. 29, 2016

(65) Prior Publication Data
US 2017/0110574 A1   Apr. 20, 2017

Related U.S. Application Data

(63) Continuation of application No. 14/479,460, filed on Sep. 8, 2014, now Pat. No. 9,536,999.

(51) Int. Cl.
*H01L 29/423* (2006.01)
*H01L 29/78* (2006.01)
(Continued)

(52) U.S. Cl.
CPC ........ *H01L 29/7813* (2013.01); *H01L 27/088* (2013.01); *H01L 29/4236* (2013.01); *H01L 29/66734* (2013.01)

(58) Field of Classification Search
None
See application file for complete search history.

(56) References Cited

U.S. PATENT DOCUMENTS

| 4,551,743 A | 11/1985 | Murakami |
| 4,845,048 A | 7/1989 | Tamaki et al. |

(Continued)

FOREIGN PATENT DOCUMENTS

| DE | 10123818 B4 | 9/2006 |
| JP | 2012028494 A | 2/2012 |

(Continued)

OTHER PUBLICATIONS

Celler, G. K. et al., "Seeded oscillatory growth of Si over SiO2 by cw laser irradiation", Applied Physics Letters, 1982, pp. 1043-1045.

(Continued)

*Primary Examiner* — Eric Ward
(74) *Attorney, Agent, or Firm* — Murphy, Bilak & Homiller, PLLC

(57) ABSTRACT

A semiconductor device includes transistor cells and control structures. The transistor cells include source zones of a first conductivity type and body zones of a second conductivity type. The source and body zones are formed in a semiconductor mesa formed from a portion of a semiconductor body. The control structures include first portions extending from a first surface into the semiconductor body on at least two opposing sides of the semiconductor mesa, second portions between the first portions and separated from the first surface by portions of the semiconductor mesa, and third portions connecting the first and the second portions and separated from the first surface by portions of the semiconductor mesa. Constricted sections of the semiconductor (Continued)

mesa separate third portions neighboring each other along a horizontal longitudinal extension of the semiconductor mesa.

14 Claims, 38 Drawing Sheets

(51) Int. Cl.
 *H01L 27/088* (2006.01)
 *H01L 29/66* (2006.01)

(56) References Cited

U.S. PATENT DOCUMENTS

| | | | |
|---|---|---|---|
| 6,285,057 | B1 | 9/2001 | Hopper et al. |
| 6,448,115 | B1 | 9/2002 | Bae |
| 6,521,538 | B2 | 2/2003 | Soga et al. |
| 6,551,944 | B1 | 4/2003 | Fallica et al. |
| 6,566,691 | B1 | 5/2003 | Inoue et al. |
| 7,423,316 | B2 | 9/2008 | Kawaji et al. |
| 7,445,973 | B2 | 11/2008 | Gonzalez et al. |
| 7,800,187 | B2 | 9/2010 | Matsuura |
| 7,906,388 | B2 | 3/2011 | Sonsky |
| 8,022,470 | B2 | 9/2011 | Hirler |
| 8,222,681 | B2 | 7/2012 | Schulze et al. |
| 9,231,091 | B2 | 1/2016 | Baburske et al. |
| 9,653,477 | B2 | 5/2017 | Cheng et al. |
| 2002/0160581 | A1 | 10/2002 | Watanabe et al. |
| 2004/0110383 | A1 | 6/2004 | Tanaka |
| 2004/0217434 | A1 | 11/2004 | Lee et al. |
| 2007/0040213 | A1 | 2/2007 | Hotta et al. |
| 2007/0190743 | A1 | 8/2007 | Colombo |
| 2008/0142923 | A1 | 6/2008 | Tischler |
| 2008/0265323 | A1 | 10/2008 | Miyairi |
| 2012/0018806 | A1 | 1/2012 | Furukawa et al. |
| 2012/0056241 | A1 | 3/2012 | Sumitomo et al. |
| 2012/0261760 | A1 | 10/2012 | Haneda et al. |
| 2013/0056822 | A1 | 3/2013 | Senoo |
| 2013/0069151 | A1* | 3/2013 | Ohta .................... H01L 29/407 257/331 |
| 2013/0181322 | A1 | 7/2013 | Hurwitz et al. |
| 2015/0041962 | A1 | 2/2015 | Laven et al. |
| 2015/0048413 | A1 | 2/2015 | Arakawa et al. |
| 2015/0380535 | A1 | 12/2015 | Oshino et al. |
| 2016/0293695 | A1 | 10/2016 | Xu et al. |

FOREIGN PATENT DOCUMENTS

| | | |
|---|---|---|
| JP | 2012204602 A | 10/2012 |
| KR | 1020020001016 A | 1/2002 |
| KR | 1020120062991 A | 6/2012 |

OTHER PUBLICATIONS

Sato, Tsutomu et al., "Fabrication of Silicon-on-Nothing Structure by Substrate Engineering Using the Empty-Space-in-Silicon Formation Technique", Japanese Journal of Applied Physics, vol. 43, No. 1, 2004, pp. 12-18.

Sumitomo, Masakiyo et al., "Low loss IGBT with Partially Narrow Mesa Structure (PNM-IGBT)", Proceedings of the 2012 24th International Symposium on Power Semiconductor Devices and ICs, Jun. 7, 2012, pp. 17-20.

* cited by examiner

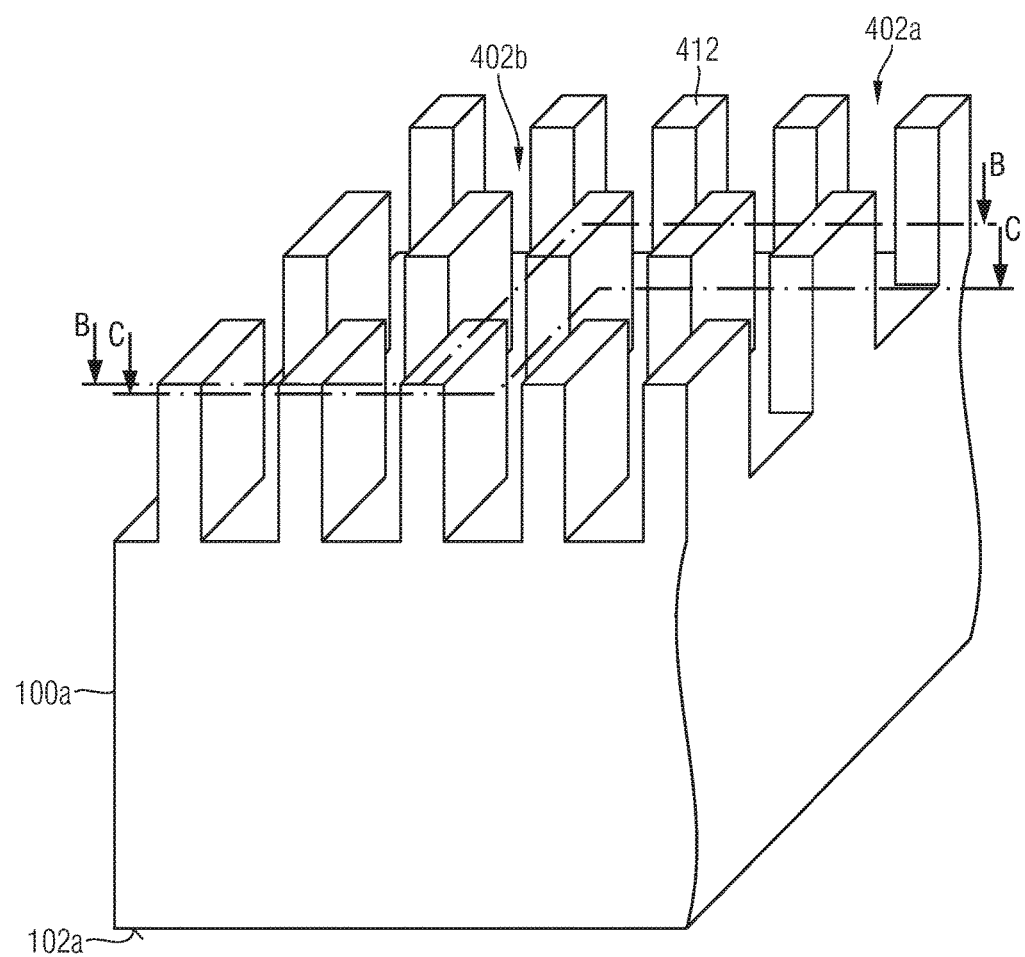

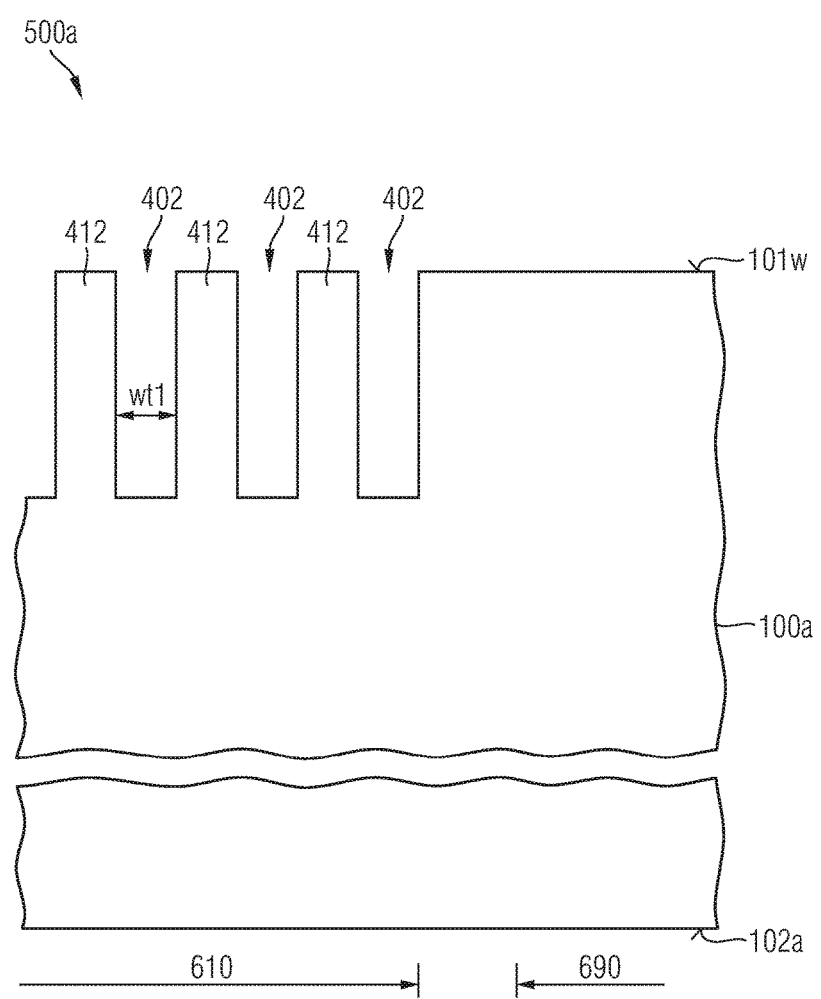

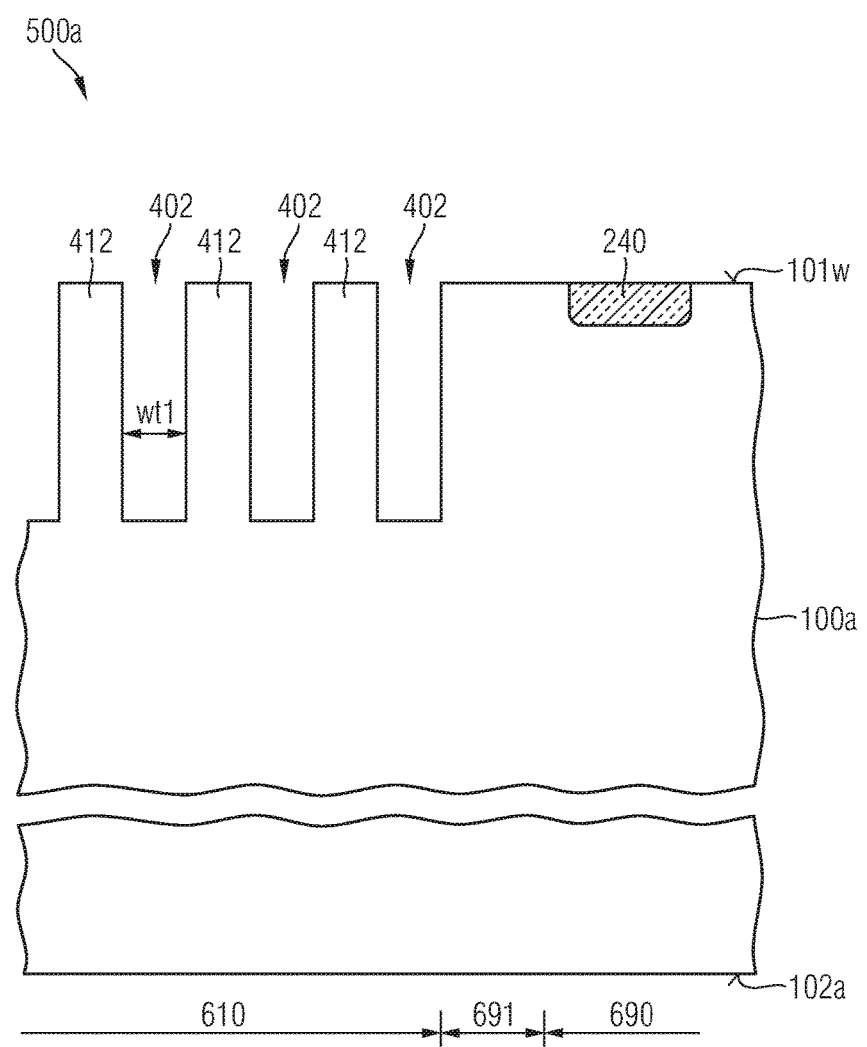

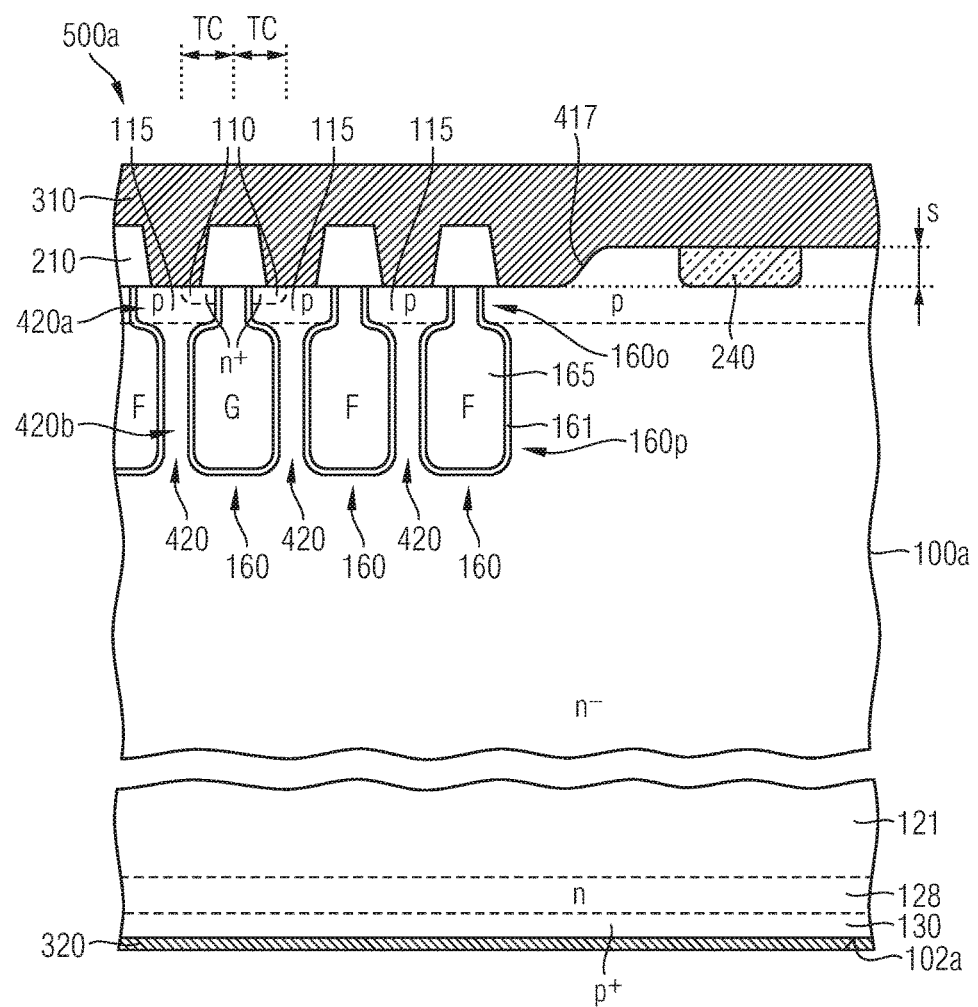

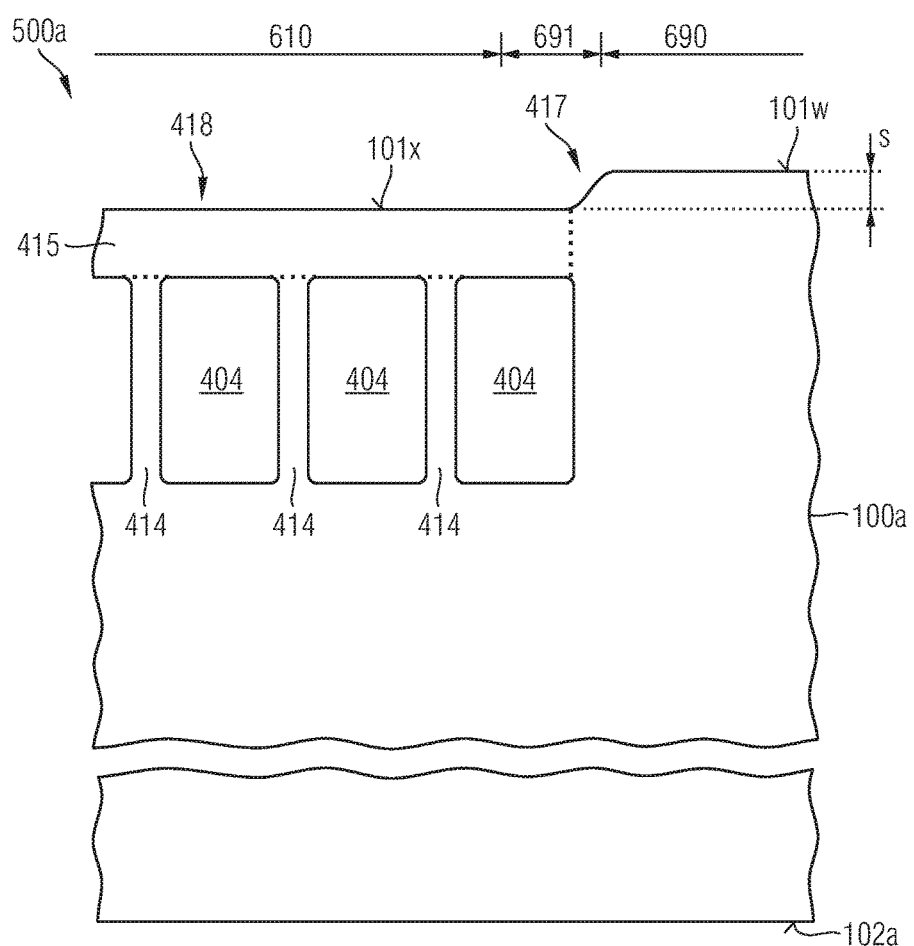

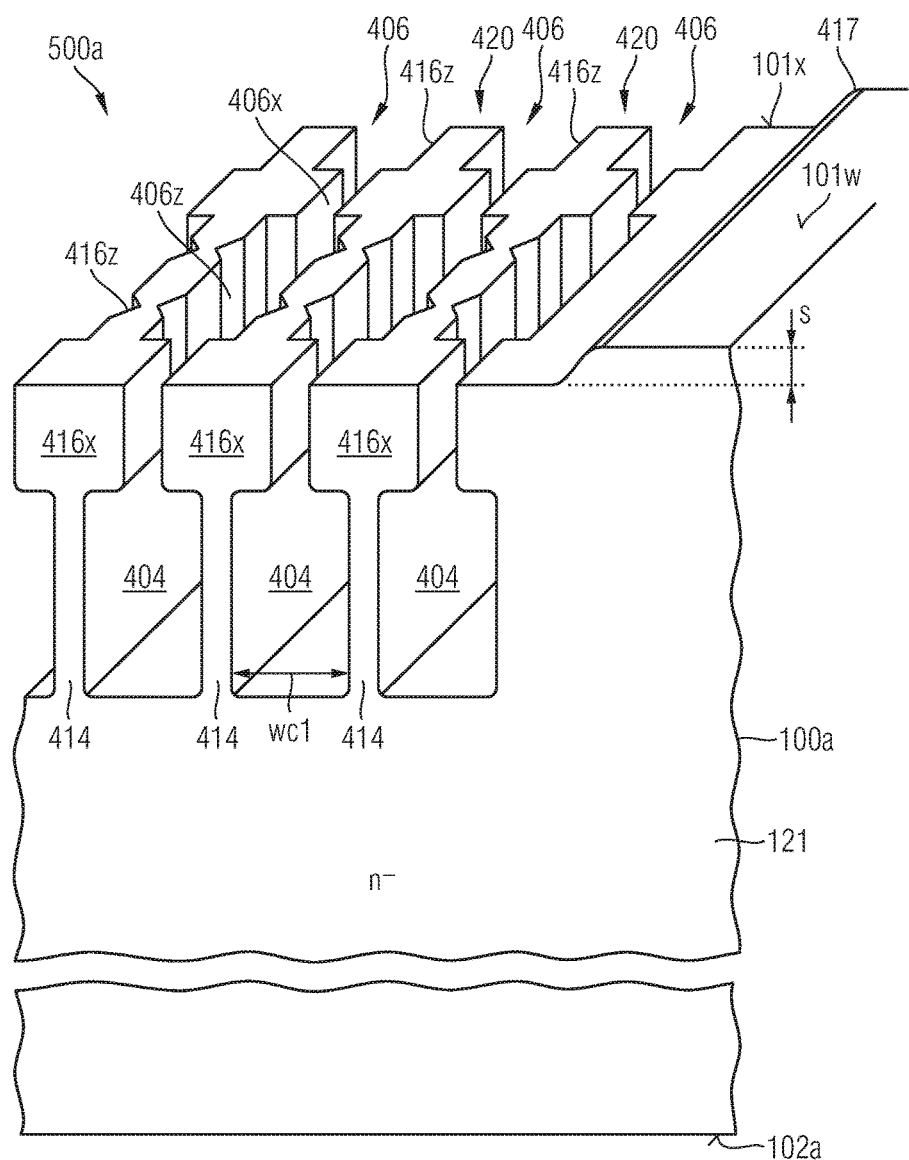

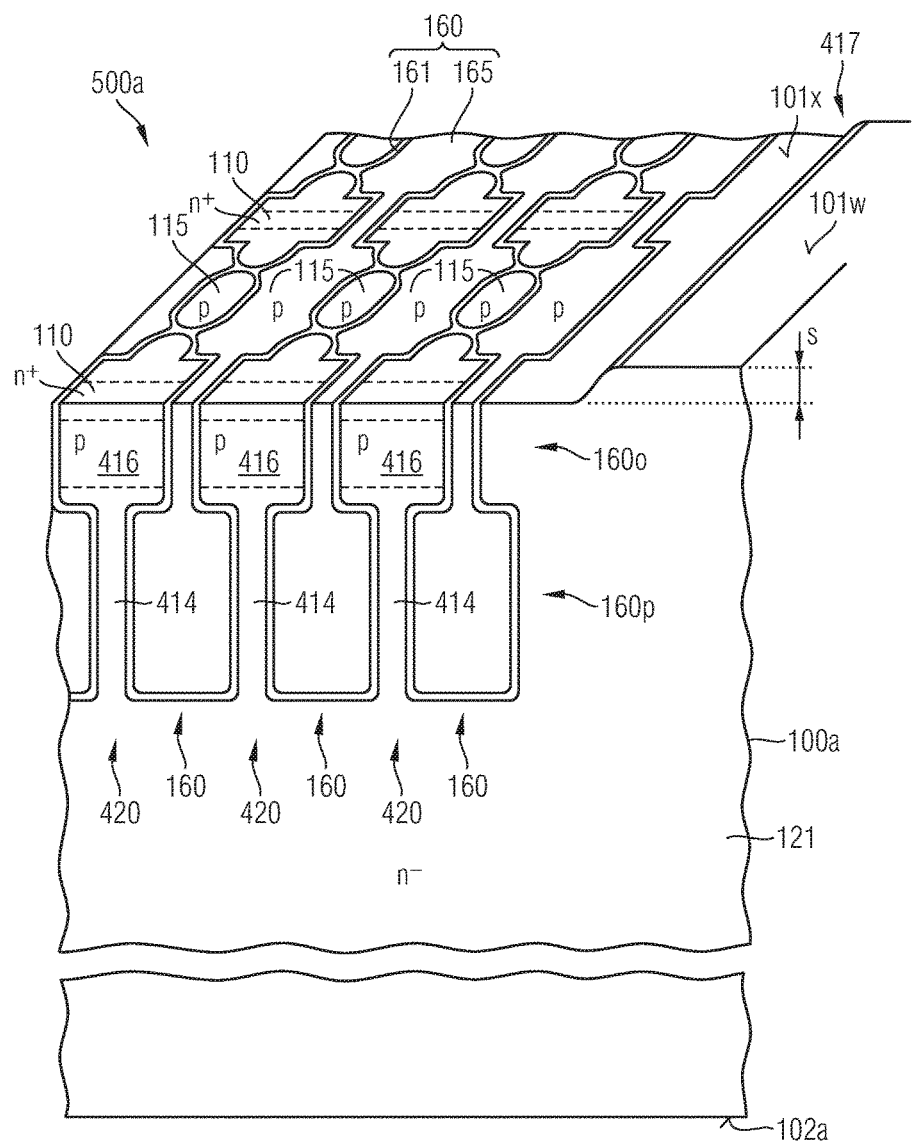

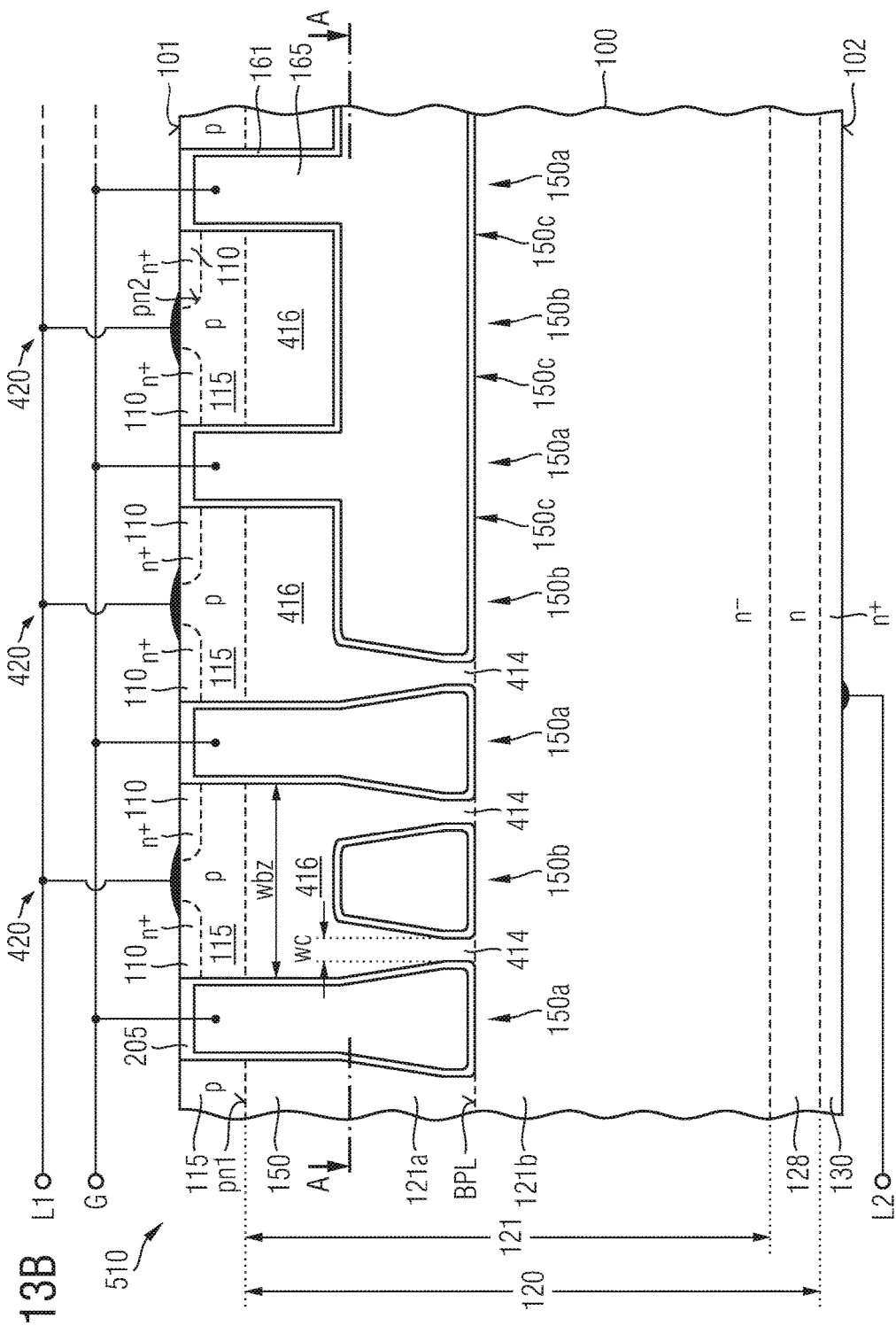

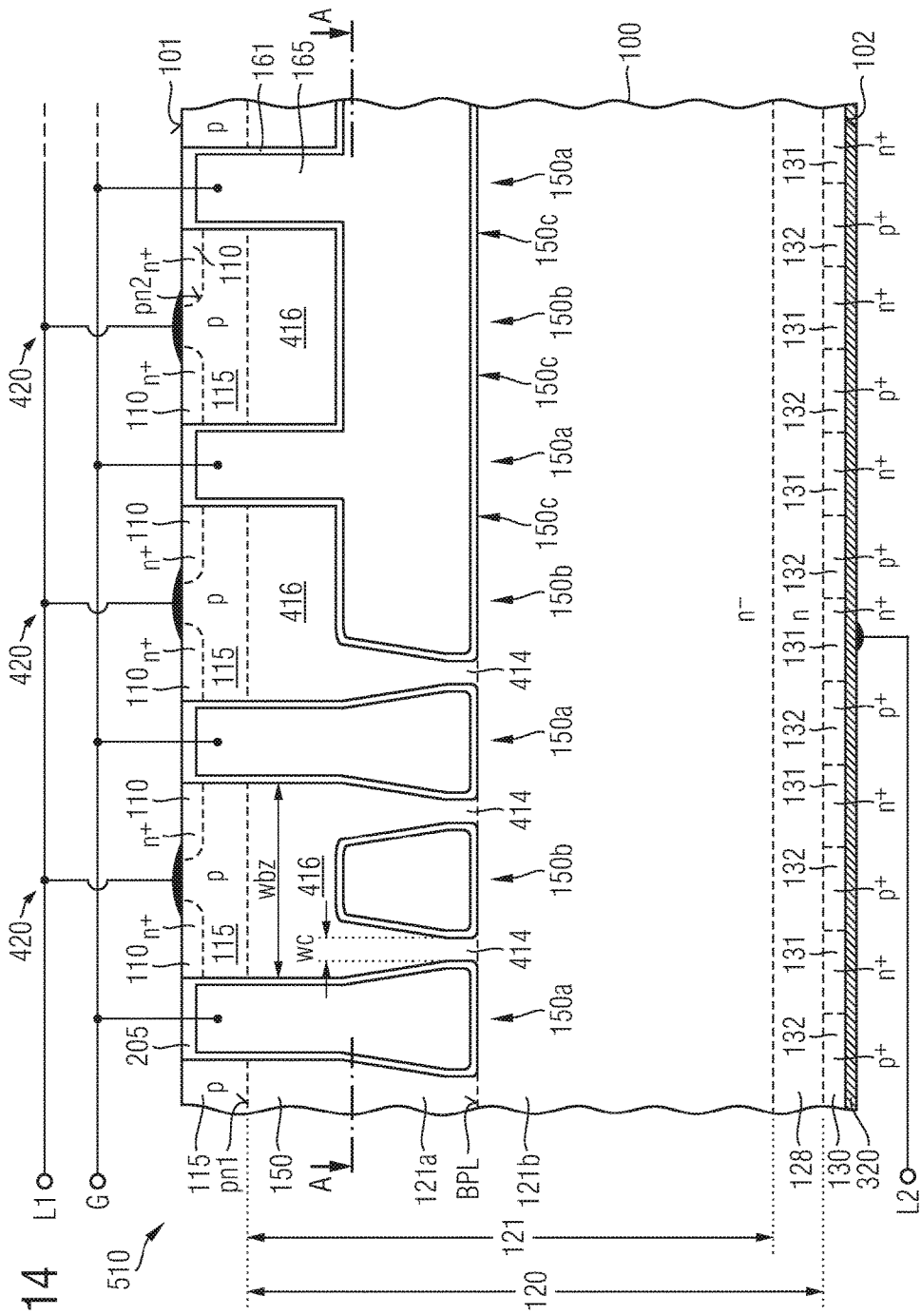

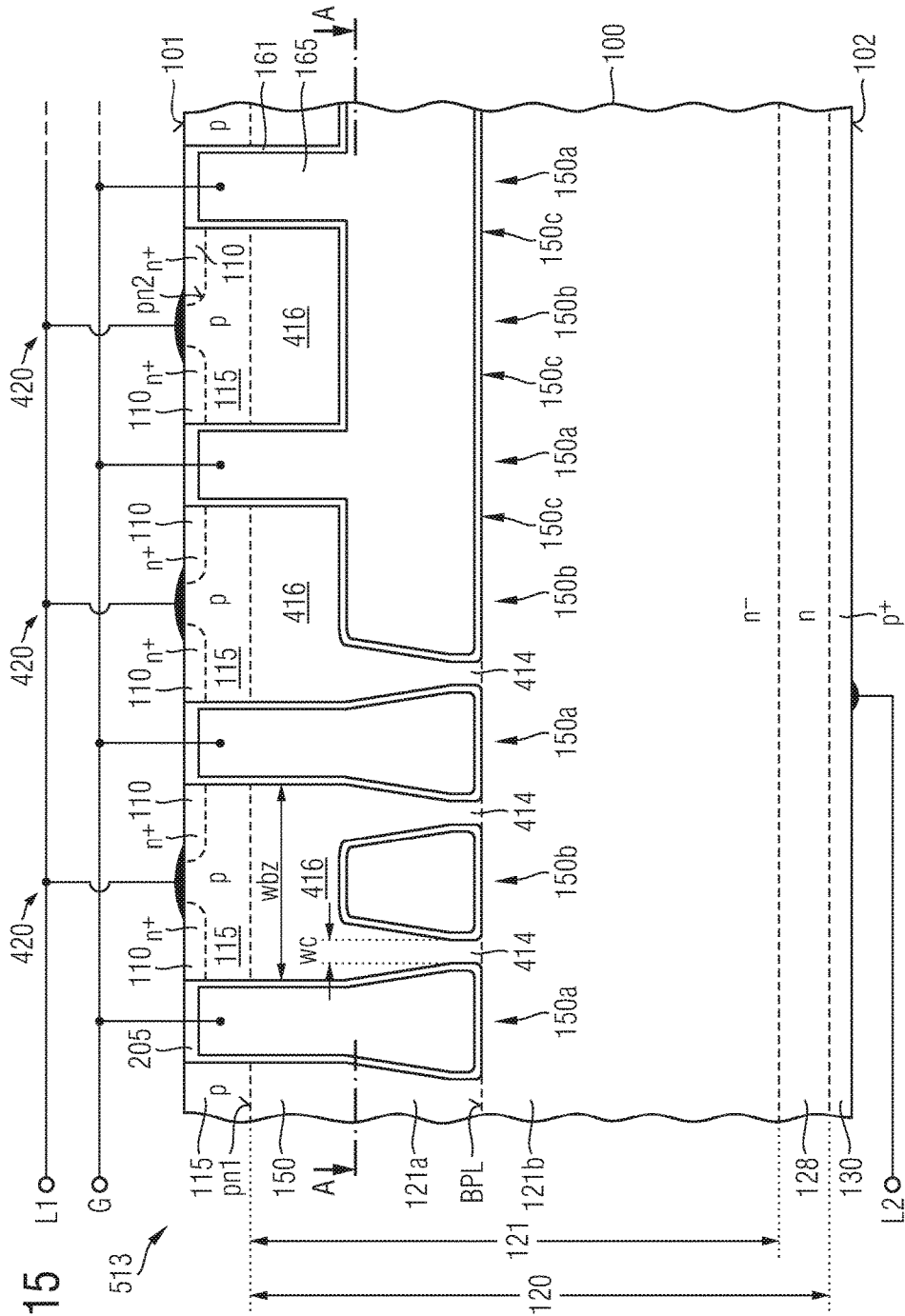

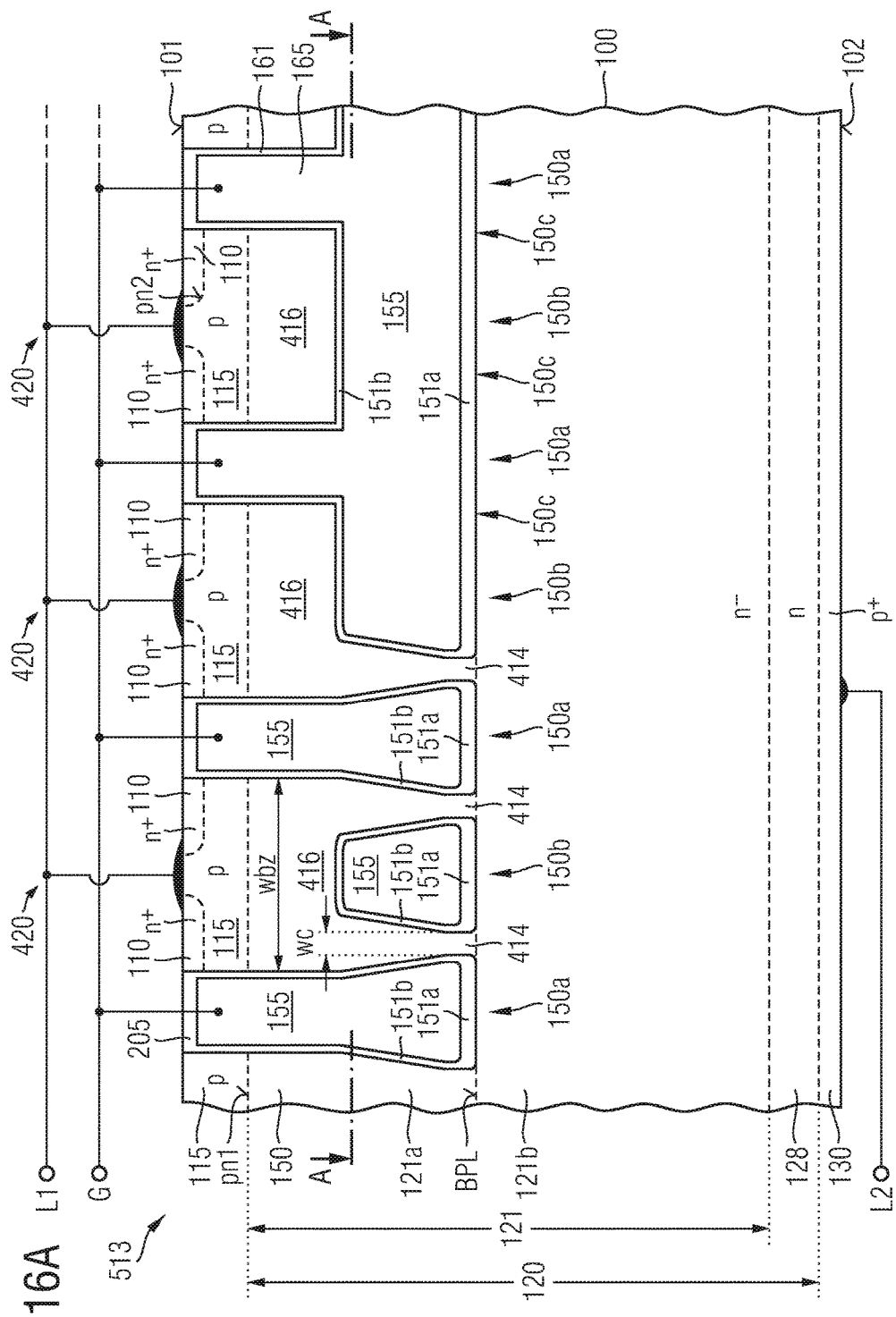

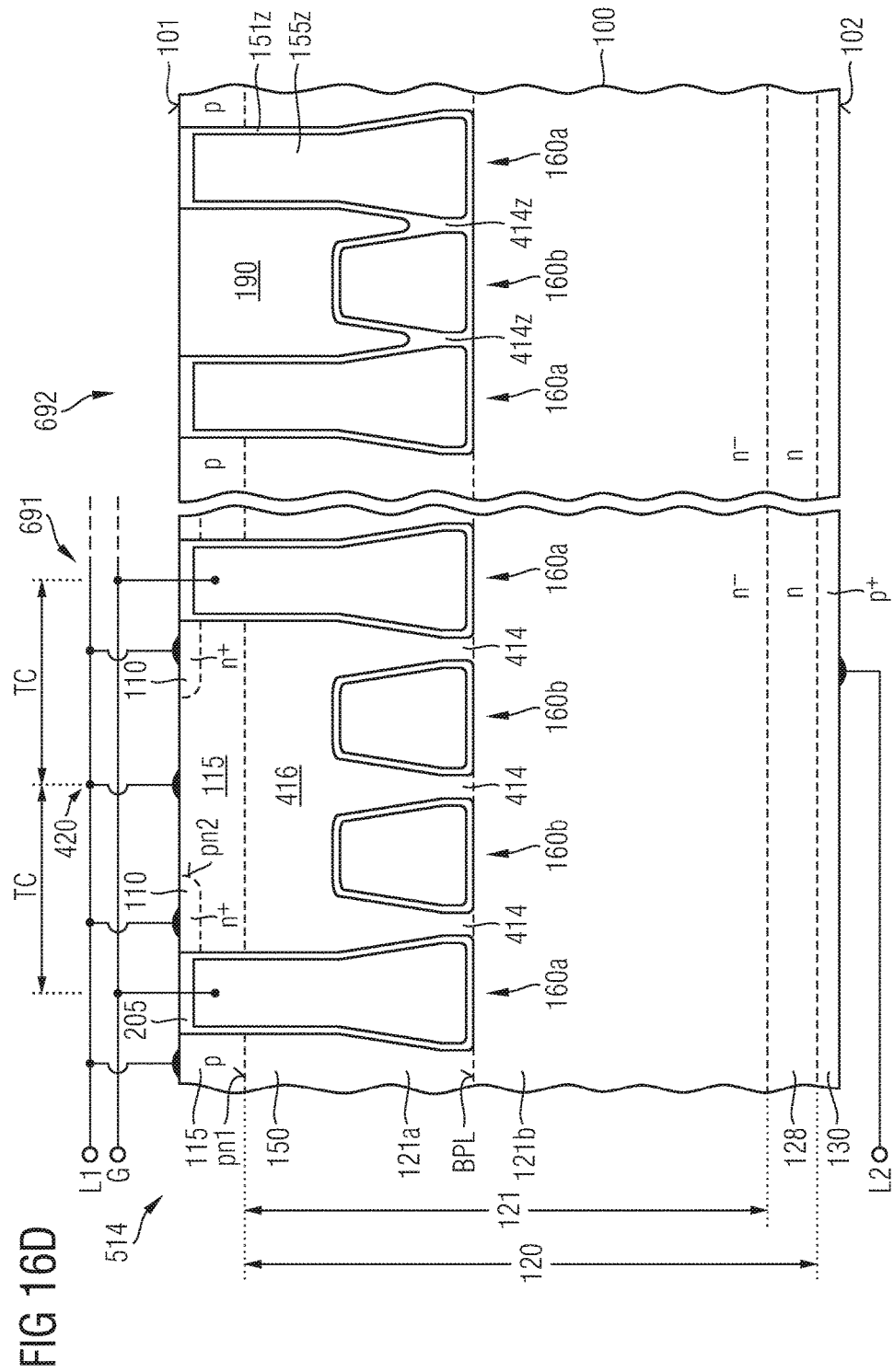

SEMICONDUCTOR DEVICE WITH CONTROL STRUCTURE INCLUDING BURIED PORTIONS AND METHOD OF MANUFACTURING

BACKGROUND

Semiconductor devices with vertical transistor cells are based on control structures extending into a drift zone and adjoining semiconductor mesas that include the source and body zones of the transistor cells. In the on-state of the transistor cells, a high density charge carrier plasma in the drift zone ensures a low on-state resistance of the semiconductor device. Typically, thin semiconductor mesas or semiconductor mesas with constrictions reduce a leakage of charge carriers and keep the charge carrier plasma density high.

It is desirable to provide semiconductor devices with a low leakage of charge carriers from a charge carrier plasma in the on-state.

SUMMARY

According to an embodiment, a semiconductor device includes transistor cells with source zones of a first conductivity type and body zones of a second conductivity type. The source and body zones are formed in a semiconductor mesa formed from a portion of a semiconductor body. Control structures include first portions extending into the semiconductor body on at least two opposing sides of the semiconductor mesa, second portions in a distance to the first surface between the first portions, and third portions in a distance to the first surface and connecting the first and the second portions, therein constricted sections of the semiconductor mesa are formed between neighboring third portions.

According to another embodiment, a semiconductor device includes transistor cells with source zones of a first conductivity type and body zones of a second conductivity type. The source and body zones are formed in a semiconductor mesa formed from a portion of a semiconductor body. Control structures include top portions arranged on two opposing sides of a top section of the semiconductor mesa and extending from a first surface into the semiconductor body as well as bottom portions in a distance to the first surface on opposing sides of a bottom section of the semiconductor mesa. The bottom section of the semiconductor mesa is connected to the top section. Horizontal longitudinal extension variations of an effective width of the bottom section are independent from variations of an effective width of the top section of the semiconductor mesa.

According to a further embodiment, a method of manufacturing a semiconductor device includes forming first trenches extending from a process surface into a semiconductor substrate formed from a semiconductor material. The semiconductor substrate is heated in a hydrogen-containing ambient, wherein a portion of the semiconductor material at the process surface fluidifies and forms a contiguous process layer spanning cavities based on the first trenches. Source and body zones of transistor cells are formed in a top semiconductor layer including at least the process layer. Second trenches are formed that extend through the top semiconductor layer and that expose at least first ones of the cavities. The first trenches may be arranged such that second ones of the cavities not exposed by the second trenches communicate with the first trenches. According to an embodiment the method further includes growing by epitaxy an epitaxial layer of the semiconductor material on the process layer to form a portion of the top semiconductor layer. The method may further include heating, after growing the epitaxial layer, the semiconductor substrate in a hydrogen-containing ambient, wherein a portion of the semiconductor material of the epitaxial layer fluidifies and forms a further process layer spanning further cavities based on the second trenches. The method may further include forming a control dielectric lining the cavities and the second trenches and forming control electrodes in the second trenches and at least some of the cavities. The source and body zones may be formed in the process layer. The method may also include forming a semiconductor oxide structure by thermal oxidation of a portion of the semiconductor material before forming the cavities and widening bottom portions of the first trenches with respect to top portions of the first trenches before heating the semiconductor substrate in the hydrogen-containing ambient.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a schematic perspective view of a portion of a semiconductor substrate for illustrating a method of manufacturing a semiconductor device according to an embodiment related to communicating cavities after forming first trenches.

FIG. 5A is a schematic cross-sectional view of a portion of a semiconductor substrate for illustrating a method of manufacturing a semiconductor device according to an embodiment providing transistor cells in a layer formed by a heating treatment in a hydrogen-containing ambient after forming first trenches.

FIG. 6A is a schematic cross-sectional view of a portion of a semiconductor substrate for illustrating a method of manufacturing a semiconductor device according to an embodiment concerning the formation of cavities after formation of a thermal semiconductor oxide.

FIG. 6C is a schematic cross-sectional view of the semiconductor substrate portion of FIG. 6B after forming transistor cells.

FIG. 7B is a schematic cross-sectional view of the semiconductor substrate portion of FIG. 7A after forming cavities by a heating treatment in a hydrogen-containing ambient.

FIG. 9A is a schematic perspective view of a portion of a semiconductor substrate for illustrating a further method of patterning semiconductor mesas along longitudinal axes after forming second trenches that locally constrict the semiconductor mesas.

FIG. 9B is a schematic perspective view of the semiconductor substrate portion of FIG. 9A after forming control structures.

FIG. 13B is a schematic vertical cross-sectional view of the semiconductor device portion of FIG. 13A along line B-B.

FIG. 14 is a schematic vertical cross-sectional view of a portion of a semiconductor device according to an embodiment providing buried control structure portions for RC-IGBTs (reverse conducting insulated gate bipolar transistors) and desaturable semiconductor diodes.

FIG. 15 is a schematic vertical cross-sectional view of a portion of a semiconductor device according to an embodiment providing buried control structure portions for IGBTs.

FIG. 16A is a schematic vertical cross-sectional view of a portion of a semiconductor device according to an embodiment referring to IGBTs with a modification of the control dielectric.

FIG. 16D is a schematic vertical cross-sectional view of a portion of a semiconductor device according to an embodiment related to semiconductor switching devices with auxiliary circuits.

DETAILED DESCRIPTION

Figure 1A:
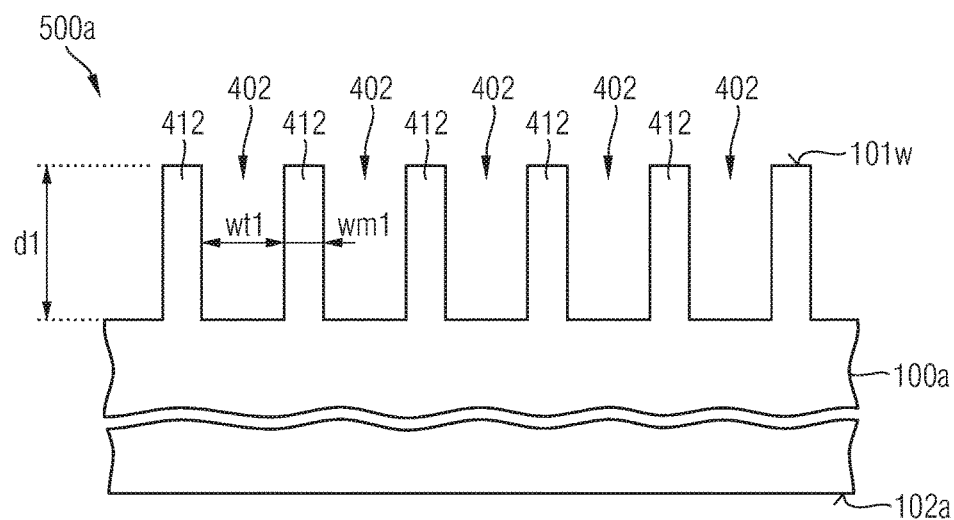
FIG. 1A is a schematic cross-sectional view of a portion of a semiconductor substrate for illustrating a method of manufacturing a semiconductor device according to an embodiment including epitaxial growth above cavities after forming first trenches in a base portion.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open, and the terms indicate the presence of stated structures, elements or features but do not preclude additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1E refer to a method of forming control structures with buried portions that locally narrow semiconductor mesas between the control structures.

A semiconductor substrate 500a may include a base portion 100a. The base portion 100a may include a base substrate of single-crystalline semiconductor material, e.g., silicon (Si), germanium (Ge), a silicon germanium crystal (SiGe), silicon carbide (SiC), gallium nitride (GaN) or another $A_{III}B_V$ semiconductor. The base portion 100a may further include a semiconductor layer, e.g., a layer grown by epitaxy on the base substrate, wherein the base substrate and the semiconductor layer may differ with regard to the conductivity type and/or the impurity concentration. A crystal lattice of the semiconductor layer may grow in registry with the crystal lattice of the base substrate.

The semiconductor substrate 500a may be, for example, a semiconductor wafer with a process surface 101w on a front side and a rear side surface 102a on a rear side, wherein the rear side surface 102a and the process surface 101w are parallel. Directions parallel to the process surface 101w are horizontal directions and a direction perpendicular to the process surface 101w defines a vertical direction.

One or more first trenches 402 are formed in the semiconductor substrate 500a, wherein the first trenches 402 extend from the process surface 101w of the base portion 100a into the semiconductor substrate 500a. For example, a first hard mask layer may be formed on the process surface 101w and patterned by photolithography to form a first hard mask. Using the first hard mask as an etch mask, the first trenches 402 may be etched by reactive ion etching, e.g., reactive ion beam etching. According to other embodiments, the first trenches 402 may be formed by locally masking an epitaxial growth of at least a portion of the semiconductor layer.

FIG. 1A shows the first trenches 402 extending from the process surface 101w into the base portion 100a. Portions of the base portion 100a between the first trenches 402 form first mesas 412.

The first trenches 402 may be arranged in several isolated cell fields and may form regular stripe patterns in the cell fields. According to other embodiments, a mean width wm1 of the first mesas 412 and/or a mean width wt1 of the first trenches 402 may increase or decrease with decreasing distance to an outer edge of the respective cell field, respectively. The widths wt1, wm1 of the first trenches 402 and the first mesas 412 may be uniform along their longitudinal axes orthogonal to the cross-sectional plane. The first trenches 402 may be separated from each other. According to other embodiments some or all of the first trenches 402 are connected to each other. For example, neighboring first trenches 402 may form a ladder-like structure with the cross-sectional view of FIG. 1A showing the rails and with the rungs arranged in a plane parallel to the cross-sectional plane. A vertical extension d1 of the first trenches 402 may be between 100 nm and 7 μm, for example in a range from 400 nm to 5 μm. The width wt1 of the first trenches 402 may range from 20 nm to 2 μm, for example from 100 nm to 300 nm. A width wm1 of the first mesas 412 may be between 20 nm and 1 μm, for example in a range from 50 nm to 400 nm. A cross-sectional area of the first trenches 402 may be invariant along a first horizontal direction perpendicular to the cross-sectional plane. According to other embodiments, the cross-sectional area of the first trenches 402 may vary along the first horizontal direction.

The semiconductor substrate 500a may be heated in a hydrogen-containing ambient to temperatures above 900° C. or above 1000° C. or between 1050 and 1150° C. for at least 5 minutes or at least 10 minutes or longer. Due to the high surface mobility of, e.g., silicon atoms in a hydrogen-containing atmosphere, the material of the base portion 100a becomes viscous and a slow moving flow of viscous silicon occludes the first trenches 402. The closed first trenches 402 form cavities 404. The heat supply is stopped when a contiguous process layer 415 formed from the resolidifying semiconductor material covers the cavities 404. When the heat supply stops, the semiconductor material of the base portion 100a solidifies and recrystallizes.

Figure 1B:
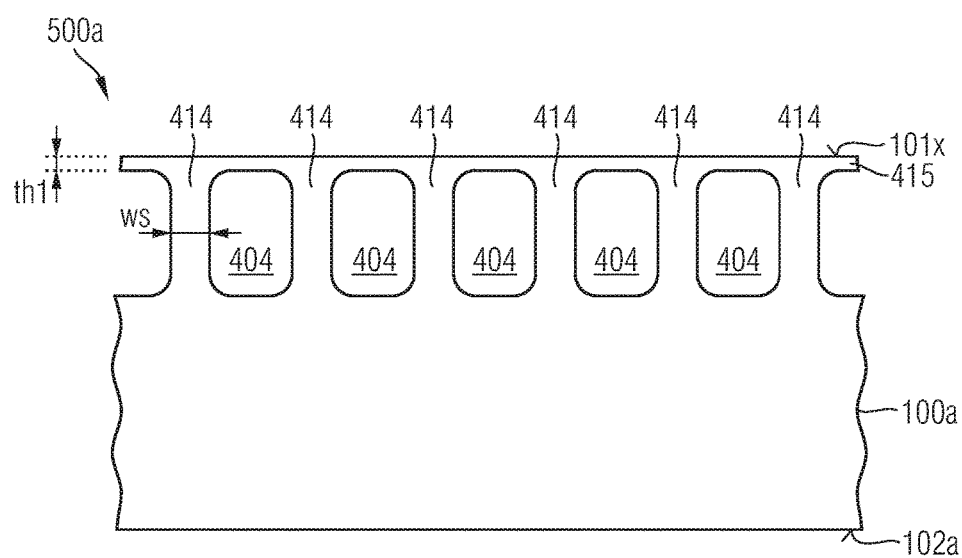
FIG. 1B is a schematic cross-sectional view of the semiconductor substrate portion of FIG. 1A after forming cavities by heating the semiconductor substrate in a hydrogen-containing ambient.

FIG. 1B shows the process layer 415 formed from portions of the semiconductor material of the base portion 100a.

A mean thickness th1 of the process layer 415 may be between 10 nm and 3 µm, for example between 50 nm and 2 µm. The process layer 415 closes the cavities 404. An exposed surface of the process layer 415 forms a modified process surface 101x. A minimum width ws of separating strips 414 between the cavities 404 may be equal to or smaller than the mean width wm1 of the first mesas 412 of FIG. 1A. The width ws of the separating strips 414 may be between 10 nm and 400 nm, for example between 100 nm and 300 nm.

According to an embodiment the process layer 415 forms a top semiconductor layer in which source zones 110 and at least portions of body zones 115 of transistor cells TC are formed. According to the illustrated embodiment an epitaxial layer 100b is formed on the modified process surface 101x, wherein the epitaxial layer 100b grows in registry with the crystal lattice of the process layer 415.

Figure 1C:
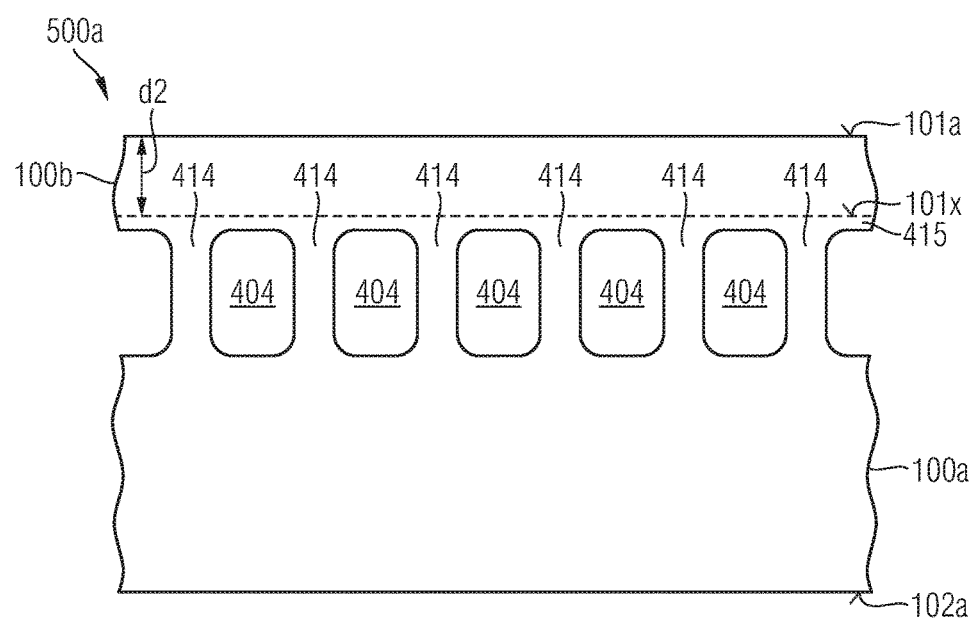
FIG. 1C is a schematic cross-sectional view of the semiconductor substrate portion of FIG. 1B after growing an epitaxial layer.

FIG. 1C shows the semiconductor substrate 500a including the base portion 100a and the epitaxial layer 100b formed on the process layer 415. A vertical extension d2 of the epitaxial layer 100b may be between 100 nm and 5 µm, for example between 200 nm and 4 µm. The epitaxial layer 100b and the process layer 415 form the top semiconductor layer. An exposed surface of the epitaxial layer 100b opposite to the process layer 415 forms a main surface 101a on a front side of the semiconductor substrate 500a. The epitaxial layer 100b and the process layer 415 form the top semiconductor layer. During epitaxy the shape of the cavities 404 may get more rounded.

Second trenches 406 that extend through the epitaxial layer 100b and the process layer 415 are formed in the main surface 100a. The second trenches 406 extend through the top semiconductor layer and open at least some of the first cavities 404 or all cavities 404. For example, a second hard mask layer may deposited and patterned by photolithography to form a second hard mask and the second trenches 406 are formed by RIE in portions of the top semiconductor layer exposed by the second hard mask.

Figure 1D:
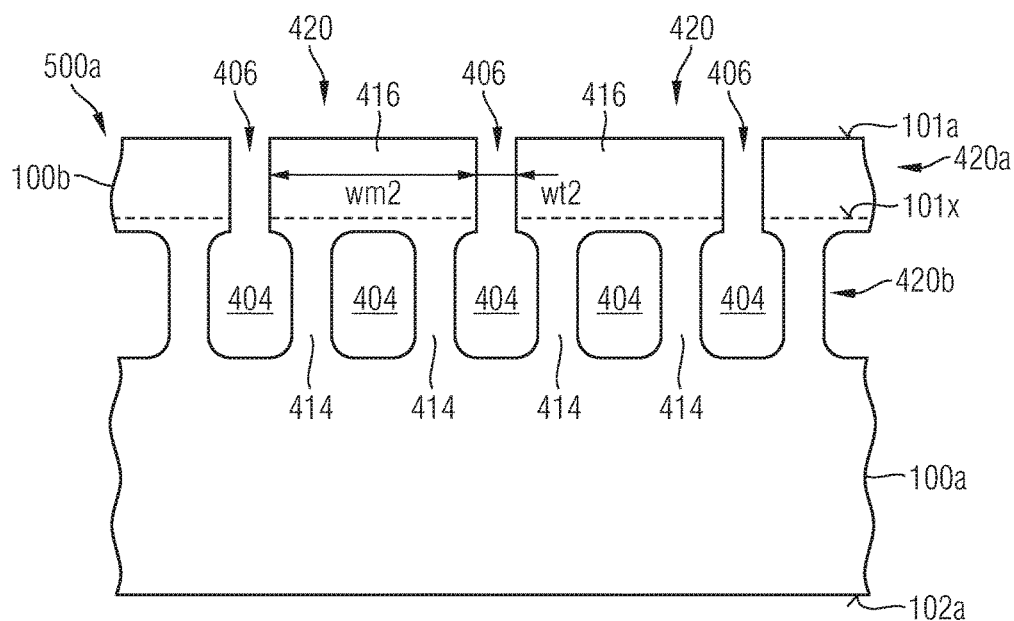
FIG. 1D is a schematic cross-sectional view of the semiconductor substrate portion of FIG. 1C after forming second trenches exposing first cavities.

FIG. 1D shows the second trenches 406 extending from the main surface 100a through the epitaxial layer 100b and the process layer 415 into the base portion 100a. The second trenches 406 may expose all cavities 404 or some of the cavities 404, for example each n-th cavity 404, with n≥2. According to an embodiment the second trenches 406 expose each second or each third cavity 404. The second trenches 406 may extend along the complete longitudinal extension of the respective cavity 404. According to other embodiments, the width of the second trenches 406 may vary along the longitudinal axes of the cavities 404 or a plurality of isolated second trenches 406 may be formed along the longitudinal axis of a concerned cavity 404. A width wt2 of the second trenches 406 may be between 20 nm and 1 µm, for example between 300 nm and 800 nm. Second mesas 416 formed between neighboring second trenches 406 may have a width wm2 ranging from 50 nm to 15 µm, for example from 100 nm to 800 nm. One of the second mesas 416 forms a top section 420a and the separating strips 414 connected to the respective second mesa 416 form a bottom section 420b of a semiconductor mesa 420.

According to an embodiment, after forming the second trenches 406, the semiconductor substrate 500a may be subjected to a further heating treatment in a hydrogen-containing ambient, wherein the vertical extension of all or some of the cavities 404 may be modified. For example, a comparatively short heat treatment in a hydrogen-containing atmosphere may round corners and edges along transitions between the cavities 404 and the second trenches 406.

According to another embodiment, a further process layer may be grown that closes the second trenches 406 and a further epitaxial layer may be grown on the further process layer.

Source zones 110 and at least portions of body zones 115 are formed in the top semiconductor layer including at least the epitaxial layer 100b and the process layer 415, or, in absence of any epitaxial layer, consisting of the process layer 415. Control structures including gate structures 150 with gate electrodes 155 are formed in the second trenches 406 and the cavities 404. The control structures may further include field electrode structures with field electrodes that may be electrically connected to the source zones 110.

According to an embodiment, gate structures 150 may be formed in the second trenches 406 as well as in the cavities 404. According to other embodiments, the gate structures 150 are formed at least in portions of the second trenches 406 and field electrode structures with field electrodes dielectrically insulated from the gate electrodes 155 are formed at least in portions of the cavities 404. According to further embodiments, the gate structures 150 may be formed at least in portions of the cavities 404 and the field electrode structures with field electrodes dielectrically insulated from the gate electrodes 155 are formed at least in portions of the second trenches 406.

Figure 1E:
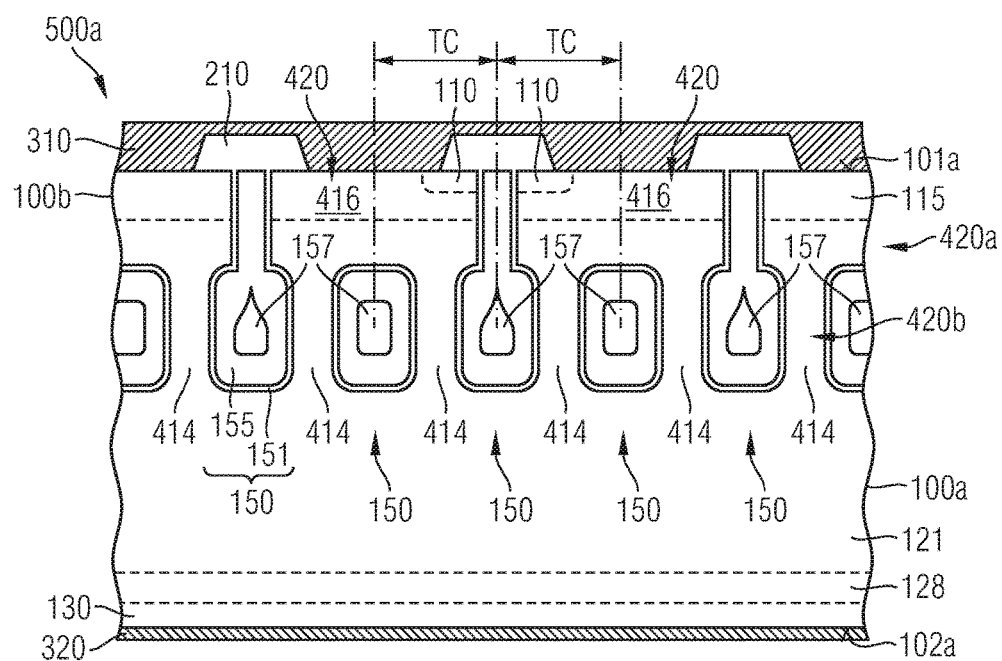
FIG. 1E is a schematic cross-sectional view of the semiconductor substrate portion of FIG. 1D after forming transistor cells above the cavities.

FIG. 1E refers to an embodiment with the gate structures 150 formed in both the second trenches 406 and the cavities 404 of FIG. 1D. The gate structures 150 include a gate dielectric 151, which may be formed by thermal oxidation of the semiconductor material of the base portion 100a and the epitaxial layer 100b or by highly conformal layer deposition of a dielectric material. The gate structures 150 further include gate electrodes 155 formed by depositing conductive material, for example heavily doped polycrystalline silicon, and removing portions of the deposited conductive material from above the main surface 101a. Since second cavities 404, which are not opened by the second trenches 406, communicate with the first cavities 404 opened by the second trenches 406, materials and process fluids deployed to the semiconductor substrate 500a can flow into all second cavities.

An interlayer dielectric 210 may be deposited and patterned by photolithography such that openings in the interlayer dielectric 210 expose portions of the source and body zones 110, 115. Along the second surface 102a a heavily doped pedestal layer 130 may be formed, for example from the base substrate or, in absence of a heavily doped base substrate, by an implant through the rear side surface 102a. Portions of the semiconductor substrate 500a between the body zones 115 and the pedestal layer 130 may form a weakly doped drift zone 121 and a field stop layer 128 between the drift zone 121 and the pedestal layer 130. A first load electrode 310 may be formed in direct contact with the source and body zones 110, 115 on the front side and a second load electrode 320 directly adjoining the pedestal layer 130 may be formed on the rear side.

FIG. 1E shows interconnected gate structures 150 in at least some of the cavities 404 and the second trenches 406 of FIG. 1D. The material of the gate electrodes 155 may leave voids 157 in the former cavities 404 or may fill them completely. The source zones 110 may be formed in each semiconductor mesa 420, or in each m-th semiconductor mesa 420, with m≥2. Within each semiconductor mesa 420, one single source zone 110 may directly adjoin one of the neighboring gate structures 150 or both, or two separated source zones 110 may adjoin both neighboring gate structures 150. A transistor cell TC includes a half of a semiconductor mesa 420 including a source zone 110 and the adjoining portions of the gate structures 150. The body zones 115 are formed in the top sections 420a of the semiconductor mesas 420. According to an embodiment, the body zones 115 do not extend into the separating strips 414.

The interconnected gate structures 150 may be formed in all cavities 404 and second trenches 406 of FIG. 1D. According to another embodiment, the gate structures 150 are formed in only some of the cavities 404 and second trenches 406 of FIG. 1D and field electrode structures with field electrodes that may be electrically connected to the source zones 110 may be formed in further ones of the cavities 404 and second trenches 406.

A plurality of identical semiconductor dies for semiconductor devices may be obtained from the semiconductor substrate 500a by a separation process that includes, for example, cutting, sawing or laser dicing.

Figure 2A:
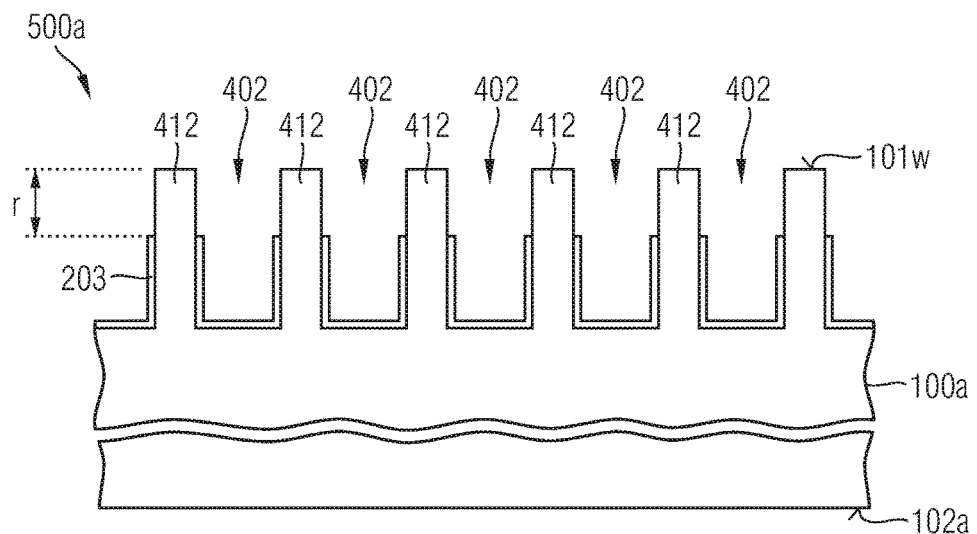
FIG. 2A is a schematic cross-sectional view of a portion of a semiconductor substrate for illustrating a method of manufacturing a semiconductor device according to an embodiment concerning a mask liner in first trenches, after providing the mask liner.
Figure 2B:
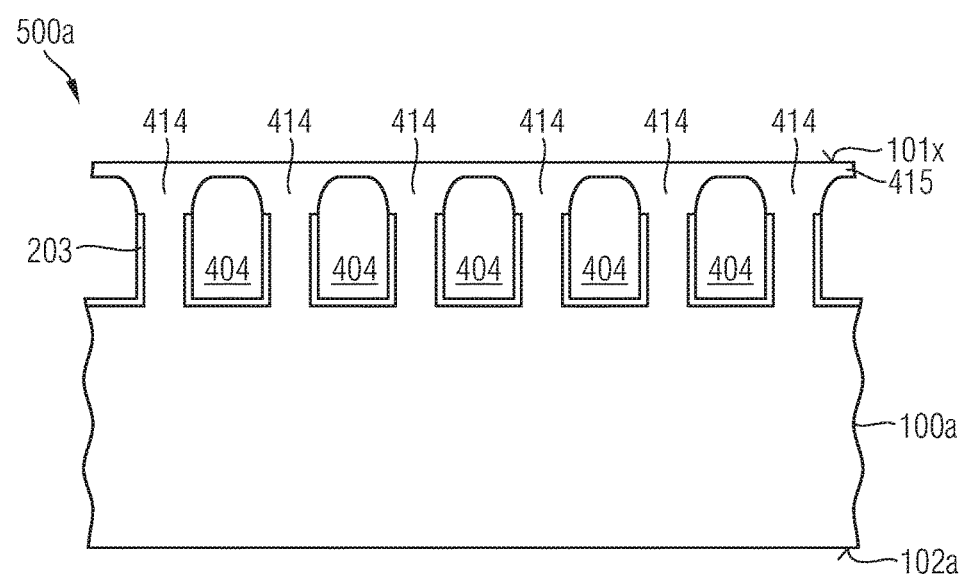
FIG. 2B is a schematic cross-sectional view of the semiconductor substrate portion of FIG. 2A after forming cavities by a heating treatment in a hydrogen-containing ambient.

FIGS. 2A and 2B refer to an embodiment with a patterned mask liner 203 supporting the formation of the cavities 404.

After formation of the first trenches 402 as illustrated in FIG. 1A, a mask layer may be formed on the process surface 101w as well as along inner sidewall and bottom portions of the first trenches 402. Forming the mask layer may include a heating treatment of the semiconductor substrate 500a in an ambient containing oxygen and/or nitrogen, and/or deposition of at least one mask material. According to an embodiment, forming the mask layer includes a highly conformal deposition using, e.g., TEOS (tetraethyl orthosilicate) as precursor material.

According to a further embodiment, the mask layer may include at least one low-conformal layer, e.g., an HDP (high density plasma) oxide that closes the first trenches 402 with mask plugs, e.g., oxide plugs leaving voids in the first trenches 402.

The mask layer may be recessed such that portions of the mask layer outside the first trenches 402 and on portions of the sidewalls of the first trenches 402 adjoining the process surface 101w are removed.

A mask layer forming mask plugs may be isotropically recessed. For recessing a conformal mask layer that does not form plugs in the first trenches 402, a sacrificial material. e.g., a resist may be deposited and recessed to form resist plugs in portions of the first trenches 402 averted from the process surface 101w. The resist plugs may be used as an etch mask during the recess of the mask layer. After the recess of the mask layer, the resist plugs may be removed.

FIG. 2A shows a mask liner 203 formed from remnant portions of the mask layer. Portions of the sidewalls of the first trenches 402 oriented to the process surface 101w are exposed. A vertical extension r of the exposed sidewall portions may be selected such that the volume of the semiconductor material of the exposed portions of the first mesas 412 is sufficient to close the first trenches 402 and to form a contiguous process layer of a desired thickness.

During the following heating treatment in hydrogen-containing atmosphere, the mask liner 203 keeps in shape portions of the first mesas 412 covered by the mask liner 203 such that the width of separating strips 414 between the cavities 404 is exclusively defined by the width of the first mesas 412 and is not subjected to process variations of the heat treatment.

The process may proceed as discussed with reference to FIGS. 1C to 1E, wherein the mask liner 203 may be removed prior to the formation of a control dielectric or may form a portion of the control dielectric, for example, a portion of a field dielectric or the gate dielectric.

Figure 3A:
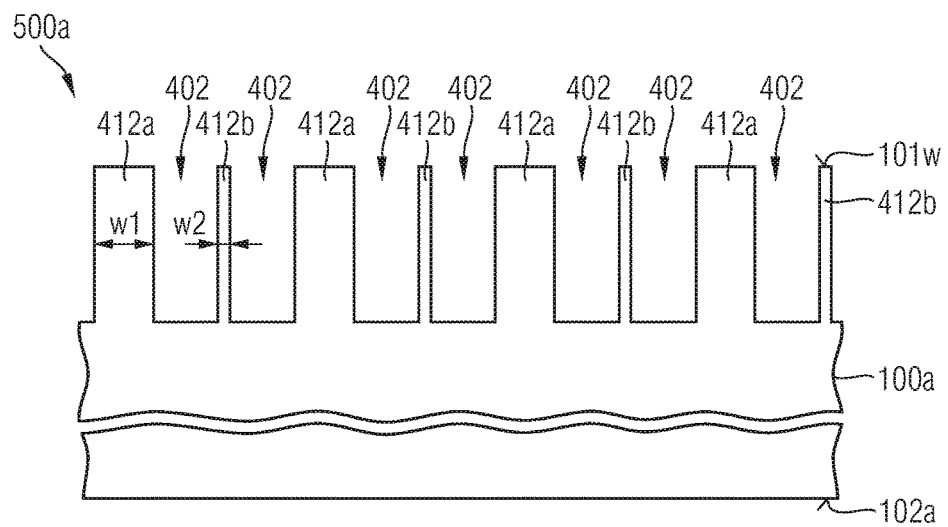
FIG. 3A is a schematic cross-sectional view of a portion of a semiconductor substrate for illustrating a method of manufacturing a semiconductor device according to an embodiment providing wide cavities, after forming first trenches in a base layer.
Figure 3B:
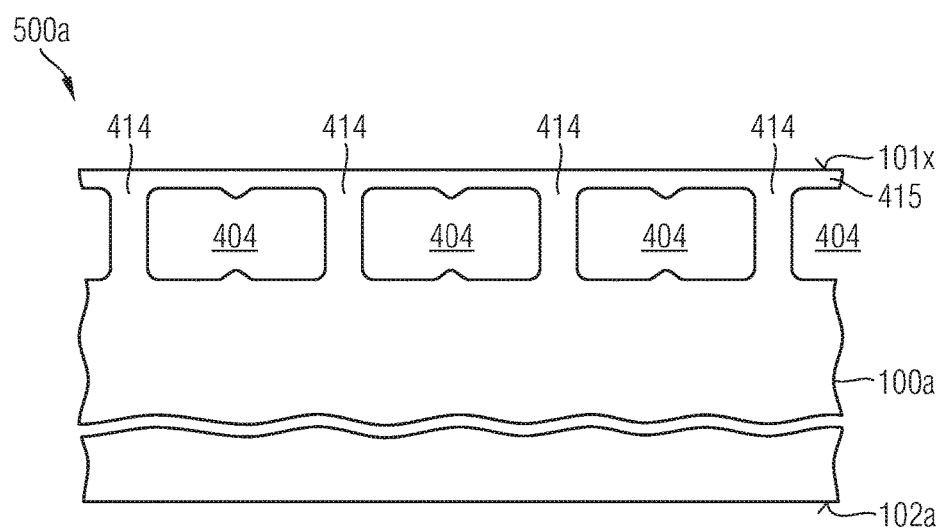
FIG. 3B is a schematic cross-sectional view of the semiconductor substrate portion of FIG. 3A after forming cavities by a heating treatment in a hydrogen-containing ambient.
Figure 3C:
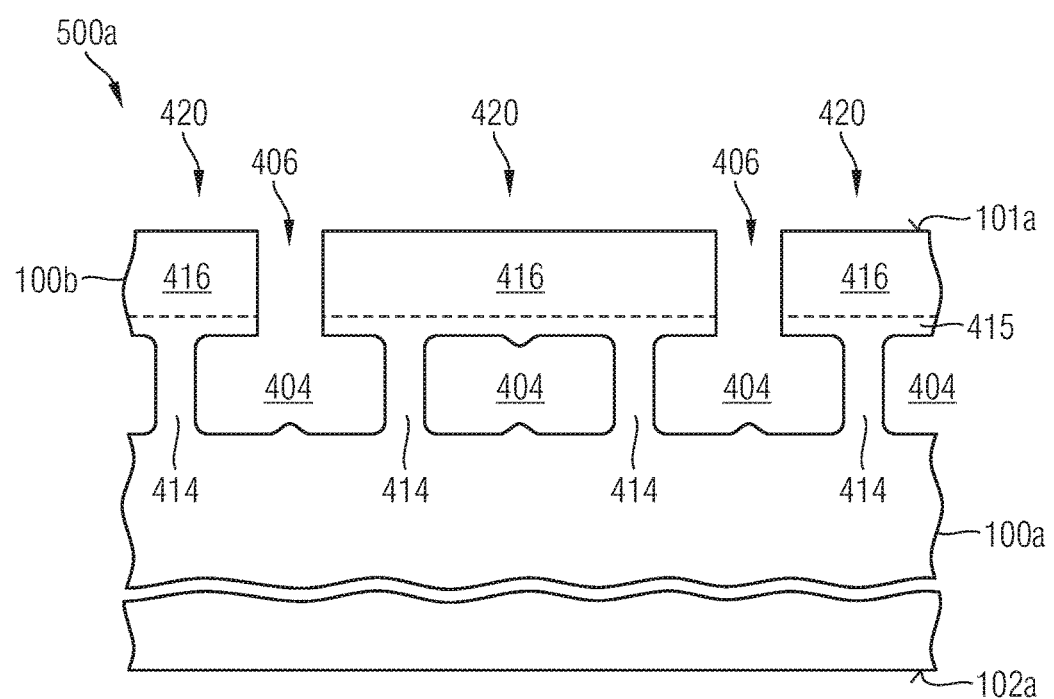
FIG. 3C is a schematic cross-sectional view of the semiconductor substrate portion of FIG. 3B after forming second trenches opening first cavities.

FIGS. 3A to 3C refer to an embodiment providing wide cavities. The first trenches 402 are formed such that both wide 412a and narrow 412b first mesas are formed between pairs of neighboring first trenches 402.

According to the embodiment of FIG. 3A wide and narrow first mesas 412a, 412b are alternatingly arranged. According to other embodiments, more than one narrow mesa 412b may be formed between two neighboring wide first mesas 412a and vice versa. The wide first mesas 412a, the narrow first mesas 412b or both may be long mesas extending through a cell field or short mesas arranged within each cell field along a horizontal direction orthogonal to the cross-sectional plane. A width w1 of the wide first mesas 412a and a width w2 of the narrow first mesas 412b are selected such that after a heating treatment in a hydrogen-containing ambient the narrow first mesas 412b almost or completely disappear, whereas the wide first mesas 412a transform to the separating strips 414 separating neighboring cavities 404 and supporting the process layer 415, which is formed from portions of the wide and narrow first mesas 412a, 412b.

FIG. 3B shows cavities 404, wherein one cavity 404 emerges from two first trenches 402 separated by narrow first mesas 412b, respectively. The separating strips 414 are formed from remnant portions of the wide first mesas 412a.

Second trenches 406 may be etched from the main surface 101a through the process layer 415a capping the cavities 404, and, if applicable, an epitaxial layer 100b formed on the exposed modified process surface 101x of the process layer 415.

FIG. 3C shows semiconductor mesas 420 including two or more of the separating strips 414, which separate neighboring cavities 404, as well as second mesas 416 separating second trenches 406 in a horizontal direction parallel to the cross-sectional plane.

Figure 4B:
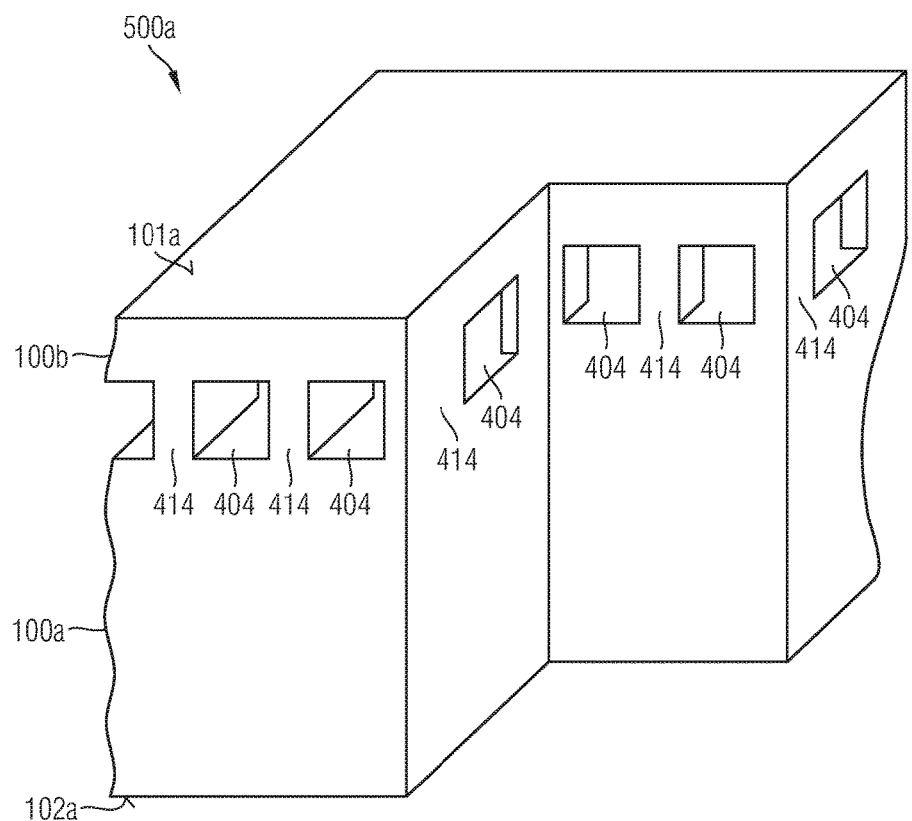
FIG. 4B is a schematic perspective view of the semiconductor substrate portion of FIG. 4A after a heating treatment in a hydrogen-containing ambient.
Figure 4C:
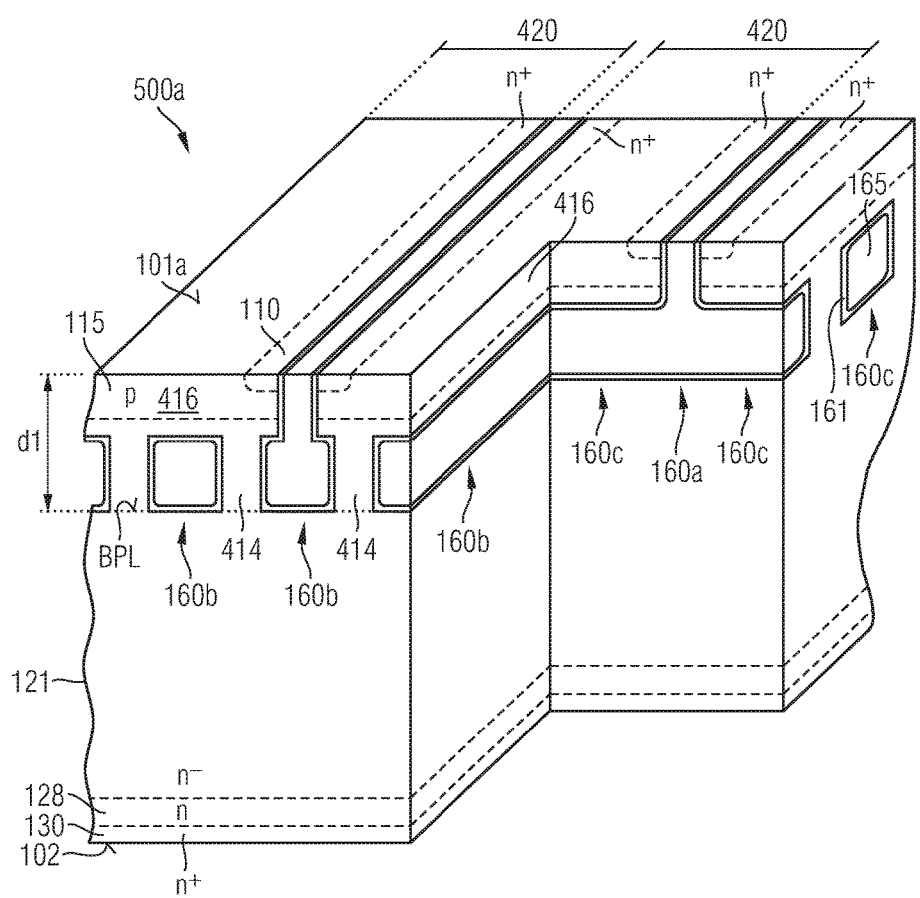
FIG. 4C is a schematic perspective view of the semiconductor substrate portion of FIG. 4B after forming transistor cells.

FIGS. 4A to 4C show details of a process according to an embodiment providing communicating cavities 404. First trenches are formed in a semiconductor substrate 500a as described above with reference to FIG. 1A.

According to FIG. 4A the first trenches include longitudinal trenches 402a extending in a first horizontal direction and lateral trenches 402b extending in a second horizontal direction and connecting neighboring longitudinal trenches 402a. The longitudinal and lateral trenches 402a, 402b may form a grid with isolated first mesas 412 arranged in the meshes. The lateral trenches 402b may be formed along lines or in a staggered manner. The semiconductor substrate 500a is heated as described with reference to FIG. 1B.

FIG. 4B shows communicating cavities 404 formed from the longitudinal and lateral trenches 402a, 402b of FIG. 4A by the heating treatment in hydrogen-containing ambient and, if applicable, by formation of an epitaxial layer 100b above the communicating cavities 404. Separation strips 414 separate neighboring cavities 404 in sections of their longitudinal axes.

From the main surface 101a formed by the exposed surface of the epitaxial layer 100b second trenches are introduced into the semiconductor substrate 500a, wherein the second trenches may expose at least portions of first ones of the cavities 404 based on the longitudinal trenches 402a of FIG. 4A. A thermal oxidation or a highly conformal deposition process may form a control dielectric 161. Since the cavities 404 communicate and are interconnected to each other, process fluids for the formation of the control dielectric 151 can be also supplied to second ones of the cavities 404 without direct access to the main surface 101a. One or more conductive materials, including, for example, heavily doped polycrystalline silicon may be deposited. The conductive material distributes in the communicating cavities 404 and the second trenches and form control electrodes 165. Before, during or after formation of the second trenches, source and body zones 110, 115 may be formed in semiconductor mesas 420, wherein a semiconductor mesa 420 includes a second mesa 416 between control structures 160 extending from the first surface 101a into the semiconductor substrate 500a as well as at least two separation strips 414 connected with the second mesa 416.

FIG. 4C shows control structures 160 including the control dielectric 161 and the control electrode 165. A control structure 160 includes a first portion 160a extending on opposing sides of the semiconductor mesas 420 from the main surface 101a into the semiconductor substrate 500a. Second portions 160b of the control structures 160 are formed in a distance to the main surface 101a between the first portions 160a. In first sections of their longitudinal axes, separation strips 414 separate the first and second portions 160a, 160b along a horizontal direction orthogonal to the longitudinal axes of the first and second portions 160a, 160b. Third portions 160c formed in a distance to the main surface 101a connect the first portions 160a with the second portions 160b in second sections of their longitudinal axes, wherein the first and second sections alternate along the respective longitudinal axis. The first, second and third portions 160a, 160b, 160c of the controls structure 160 are aligned to a bottom plane BPL parallel to the main surface 101a at a distance d1. The separation strips 414 form constricted sections of the semiconductor mesas 420.

Figure 5B:
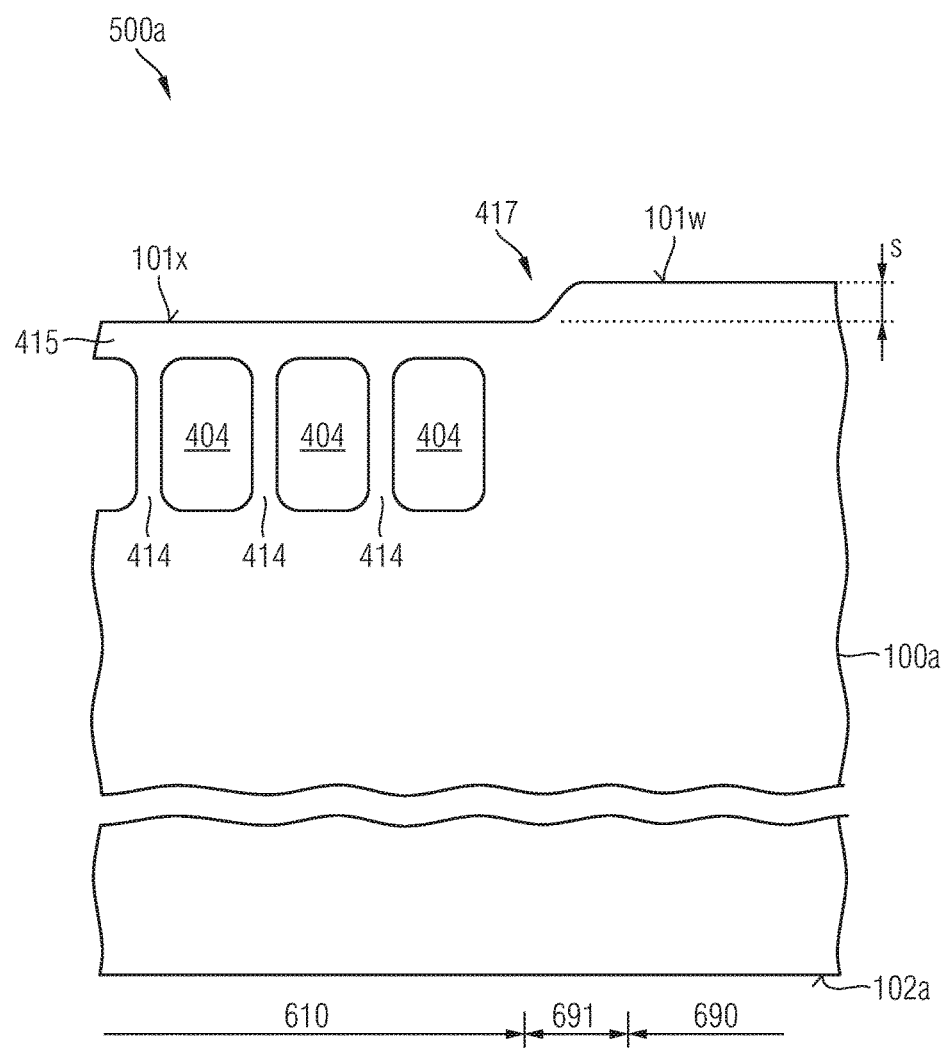
FIG. 5B is a schematic cross-sectional view of the semiconductor substrate portion of FIG. 5A after forming cavities by a heating treatment in a hydrogen-containing ambient.
Figure 5C:
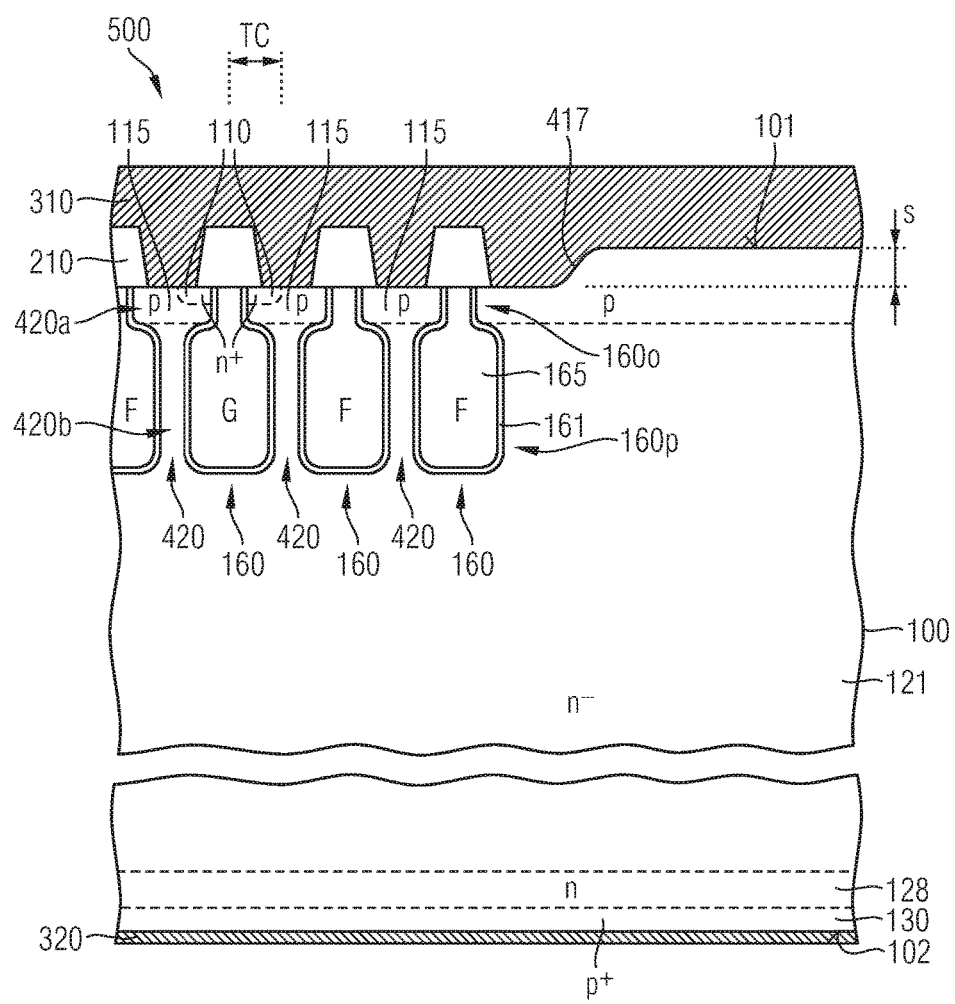
FIG. 5C is a schematic cross-sectional view of the semiconductor substrate portion of FIG. 5B after forming transistor cells.

FIGS. 5A to 5C refer to an embodiment providing source and body zones of transistor cells in a process layer formed during a heating treatment of a semiconductor substrate 500a in a hydrogen-containing atmosphere.

In an area assigned to a cell field 610 first trenches 402 are introduced from a process surface 101w into the semiconductor substrate 500a that contains at least a base portion 100a. An edge area 690 may be provided between neighboring cell fields 610.

FIG. 5A shows a portion of a cell field 610 with first trenches 402 and a portion of an edge area 690 without trenches. The vertical cross-sectional area of the first trenches 402 may be a rectangle such that first mesas 412 between neighboring first trenches 402 have approximately vertical sidewalls. According to other embodiments, the width wt1 of the first trenches 402 in a distance to the process surface 101w may be greater than along the process surface 101w. For example, the cross-sectional area of the first trenches 402 may be a trapezium and the width wt1 of the first trenches 402 increases steadily with increasing distance to the process surface 101w. According to other embodiments, the sidewalls of the first trenches 402 may have bulges such that the cross-sectional areas are bottle-shaped.

The first trenches 402 may have uniform widths and may be regularly arranged at uniform center-to-center distances. According to other embodiments, the widths of the first trenches 402 and/or their center-to-center distances may vary within each cell field. For example, the widths of the first trenches 402 may decrease with decreasing distance to the edges of the cell field to reduce the sharpness of topography effects as explained below.

The semiconductor substrate 500a is subjected to a heating treatment in a hydrogen-containing ambient. The semiconductor material of the base portion 100a becomes viscous and closes the first trenches 402

FIG. 5B shows the closed first trenches of FIG. 5A forming cavities 404. Separation strips 414 separate neighboring cavities 404. In the cell field 610 a contiguous process layer 415 is formed from the semiconductor material of the first mesas 412 in the cell field 610. The material flow into portions of the former first trenches 402 results in a step 417 between the modified process surface 101x in the cell field 610 and the original process surface 101w in the edge area 690.

FIG. 5B shows the step 417 in a transition region 691 between the cell field 610 and the edge area 690. A height s of the step 417 depends on a ratio between the volume of a portion of the first mesas 412 contributing to the process layer 415 and the volume of the filled portions of the first trenches 402 and may range from 5 nm to 1 µm, by way of example. The thickness of the process layer 415 may range from 20 nm to 3 µm, for example from 100 nm to 2 µm.

In a portion of the edge area 690, for example in a kerf area, auxiliary cavities may be formed from further first trenches, wherein the further first trenches are designed such that a significant step results from the heating treatment in the modified process surface 101w. The step delivers a high contrast for an alignment tool and may be used to precisely align further photolithographic masks to the cavities 404.

Then transistor cells TC may be formed, wherein the source and body zones 110, 115 of the transistor cells TC are exclusively formed in semiconductor mesas 420. According to the illustrated embodiment, a semiconductor mesa 420 includes one of the separation strips 414 and a second mesa 416 formed from a portion of the process layer 415 between neighboring control structures 160. As regards the formation of the control structures 160, further doped regions, and load electrodes, reference is made to the detailed description of FIG. 1E.

FIG. 5C shows a portion of a semiconductor device 500 which is based on a semiconductor die obtained by singularizing a plurality of identical semiconductor dies from the semiconductor substrate 500a of FIGS. 5A and 5B.

Transistor cells TC include source zones 110 of a first conductivity type and body zones 115 of a second conductivity type, wherein the source and body zones 110, 115 are formed in a semiconductor mesa 420, which is a portion of a semiconductor body 100 with a first surface 101 and a parallel second surface 102. Control structures 160, which may include gate structures G and field electrode structures F, include top portions 160o and bottom portions 160p, respectively. Two top portions 160o are arranged on opposing sides of a top section 420a of an intermediate semiconductor mesa 420, respectively, and extend from the first surface 101 into the semiconductor body 100. The bottom portions 160p formed in a distance to the first surface 101 on opposing sides of a bottom section 420b of the intermediate semiconductor mesa 420, wherein the top and bottom sections 420a, 420b of the semiconductor mesa 420 directly adjoin to each other.

Along a horizontal longitudinal extension, variations of an effective width of the bottom section 420b of a semiconductor mesa 420 are independent from variations of an effective width of the top section 420a of the same semiconductor mesa 420. Accordingly, along the horizontal longitudinal extension, variations of a width of a bottom portion 160p of a control structure 160 are independent from variations of a width of the top portion 160o of the same control structure 160. The bottom portions 160p of neighboring control structures 160 are isolated from each other and may be arranged along two parallel lines. A distance between the top portions 160o of neighboring control structures 160 may be greater than a distance between the bottom portions 160p of the concerned control structures 160.

The cavities 404 of the transistor cells TC as well as the process layer 415 for the source and body zones 110, 115 of the transistor cells TC may be formed at the beginning of the processing of the semiconductor substrate 500a before any heat sensitive structures are formed in or on the semiconductor substrate 500a.

According to another embodiment, the cavities 404 as well as the process layer 415 for the source and body zones 110, 115 are formed at a processing stage with at least one heat sensitive structure already formed in the semiconductor substrate 500a.

Figure 6B:
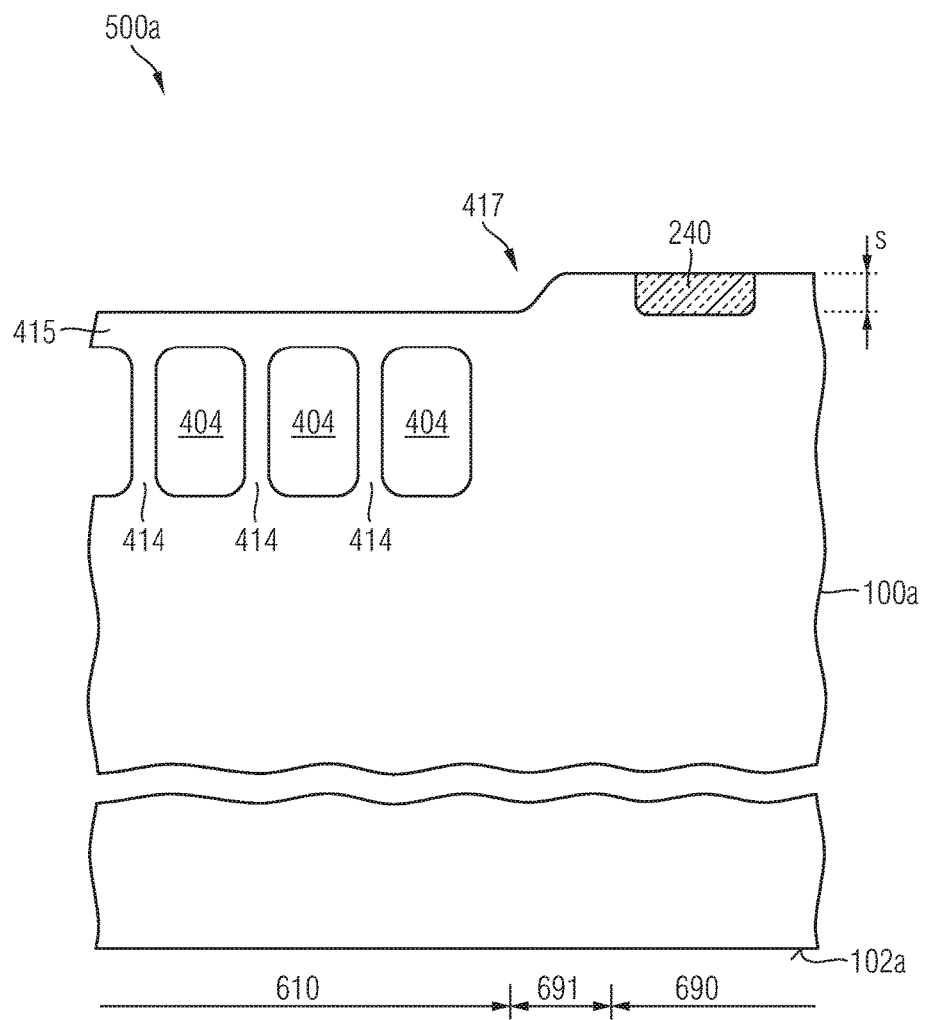
FIG. 6B is a schematic cross-sectional view of the semiconductor substrate portion of FIG. 6A after forming the cavities by a heating treatment in a hydrogen-containing ambient.

The process illustrated in FIGS. 6A to 6C differs from the process illustrated in FIGS. 5A to 5C in that a semiconductor oxide structure 240 is formed at the main surface 101a before the process layer 415 for the source and body zones 110, 115 is formed.

For example, before or after forming the first trenches 402 a semiconductor oxide structure 240 may be formed along the process surface 101x. The semiconductor oxide structure 240 may be formed, for example, by patterning an oxidation mask layer, e.g., a silicon nitride or silicon oxynitride layer and then controlling a thermal oxidation of an exposed section of the base portion 100a in openings of the oxidation mask. According to other embodiments, a first shallow trench may be etched into the process surface 101x and the semiconductor oxide is formed in the shallow trench. The depth of the shallow trench may be selected such that after incorporating the oxygen, the upper edge of the grown semiconductor oxide is approximately flush with the process surface 101x.

Since the formation of the transistor cells TC gets along without epitaxial growth, the thermal budget applied for forming the transistor cells TC is low enough to avoid damaging previously fabricated structures like the semiconductor oxide structure 240.

The same semiconductor oxide structure 240 may be used for aligning the photolithographic masks for forming the first and second trenches 402, 406 as well as further photolithographic masks.

Figure 7A:
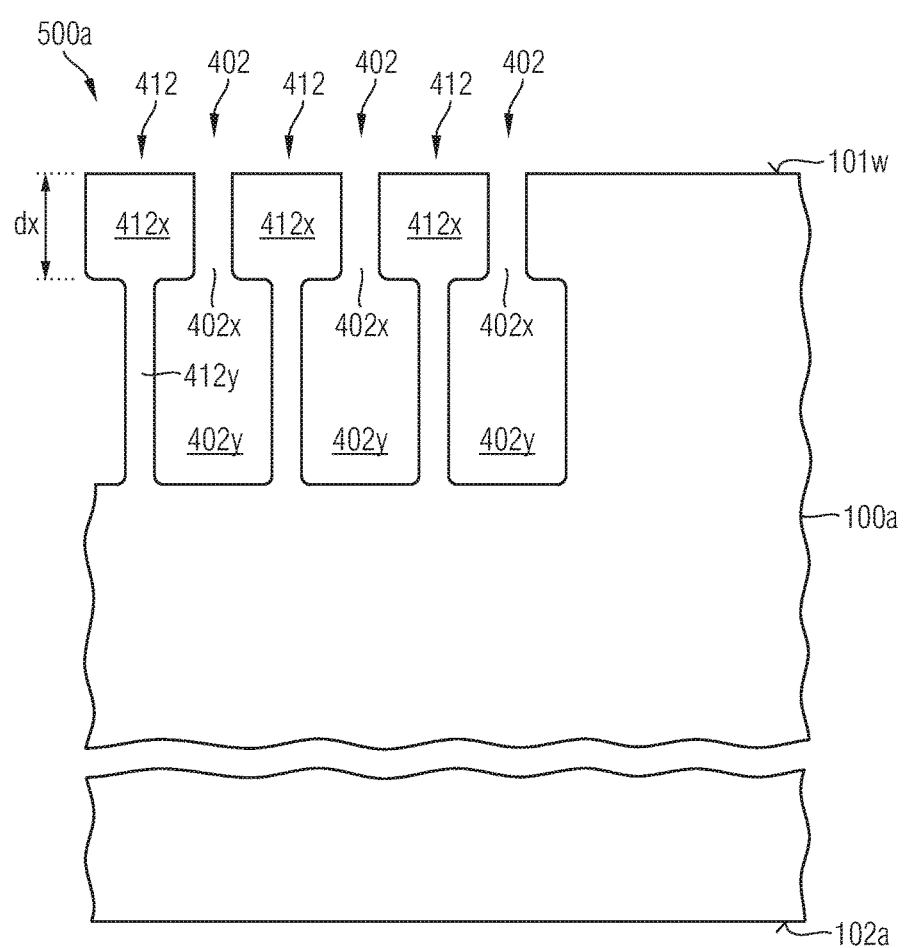
FIG. 7A is a schematic cross-sectional view of a portion of a semiconductor substrate in accordance with an embodiment related to vertically patterned first trenches after forming the first trenches.

FIGS. 7A to 7B refer to first mesas 412 with wide mesa sections 412x adjoining the process surface 101w and mainly contributing to the formation of a process layer 415 as well as with narrow mesa sections 412y mainly contributing to the formation of separation strips 414.

First trenches 402 are introduced from a process surface 101w into a semiconductor substrate 500a including a base portion 100a from a semiconductor material. For example, a first etch may be performed with increasingly anisotropic component such that the width of the first trenches 402 increases with increasing distance to the process surface 101w. Alternatively, a two or more step etch process may be performed to widen previously formed narrow trenches 402 with straight sidewalls.

FIG. 7A shows bottle-shaped first trenches 402 with wide trench portions 402y in a distance to the process surface 101w and narrow trench portions 402x between the process surface 101w and the wide trench portions 402y. The narrow trench portions 402x correspond to wide mesa portions 412x and the wide trench portions 402y correspond to narrow mesa portions 412y of the first mesas 412.

The semiconductor substrate 500a is subjected to a heating treatment in a hydrogen-containing ambient resulting in that the semiconductor material becomes viscous and occludes the first trenches 402.

FIG. 7B shows the closed cavities 404 emerging from the first trenches 402 of FIG. 7A. A thickness of the resulting process layer 415 covering the cavities 404 may be adjusted by selecting an appropriate vertical extension dx of the wide mesa portions 412x. Due to the high volume ratio of wide mesa portions 412x to narrow trench portions 402x a height s of a step 417 in a transition region 691 between the cell field 610 and an edge area 690 is comparatively low.

The process may proceed with forming second trenches opening the cavities 404, forming control structures in the second trenches as well as in the cavities 404, and forming source and drain zones of transistor cells in the process layer 415 as described with reference to FIGS. 1E and 6C.

Forming the control structures includes depositing one or more conductive materials filling at least partially the second trenches and the cavities 404. After deposition of the conductive material(s), material deposited on a modified process surface 101x of the process layer 415 is removed, for example using a polishing step such as CMP (chemical mechanical polishing). The polishing stops at the upper edge of the base portion 100a, i.e., the original process surface 101w. Remnant portions of the deposited conductive materials fill a shallow trough 418 above the cell field 610. An isotropic etch may remove the conductive material filling the trough 418 without consuming material deposited into the second trenches. The shallower the trough 418 is the better is the control of the isotropic etch.

Along the longitudinal axes, the second trenches may be formed analogously to the first trenches and the cavities.

FIGS. 8A to 10B refer to embodiments decoupling the longitudinal pattern of the second trenches from the longitudinal pattern of the first trenches.

Figure 8A:
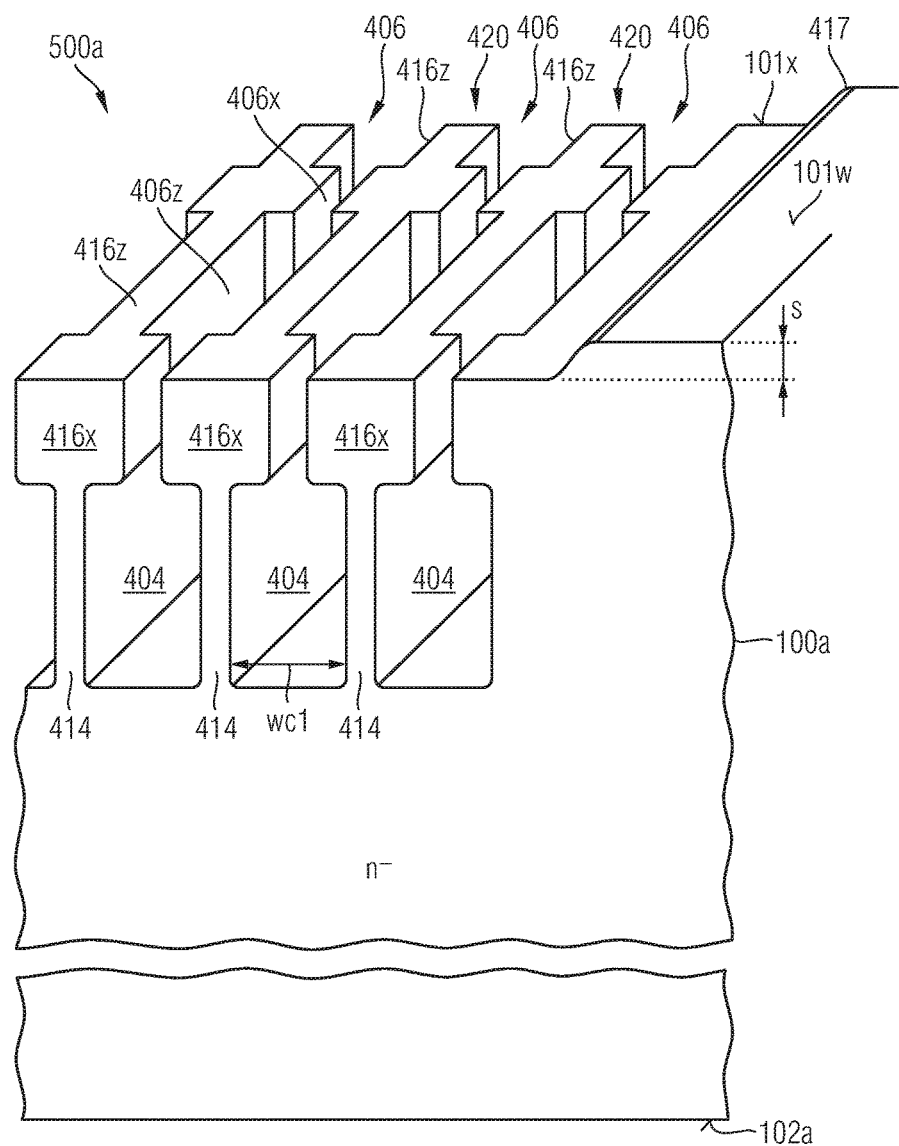
FIG. 8A is a schematic perspective view of a portion of a semiconductor substrate in accordance with an embodiment related to semiconductor mesas with varying widths along longitudinal axes after forming second trenches.

In FIG. 8A the cavities 404 have a uniform width wc1 along their longitudinal axes. The second trenches 406 have narrow second trench sections 406x alternating with wide second trench sections 406z along their longitudinal axes. Narrow second mesa sections 416z correspond to wide second trench sections 406z and wide second mesa sections 416x correspond to narrow second trench sections 406x. Control structures 160 are formed in the second trenches 406 and the cavities 404.

Figure 8B:
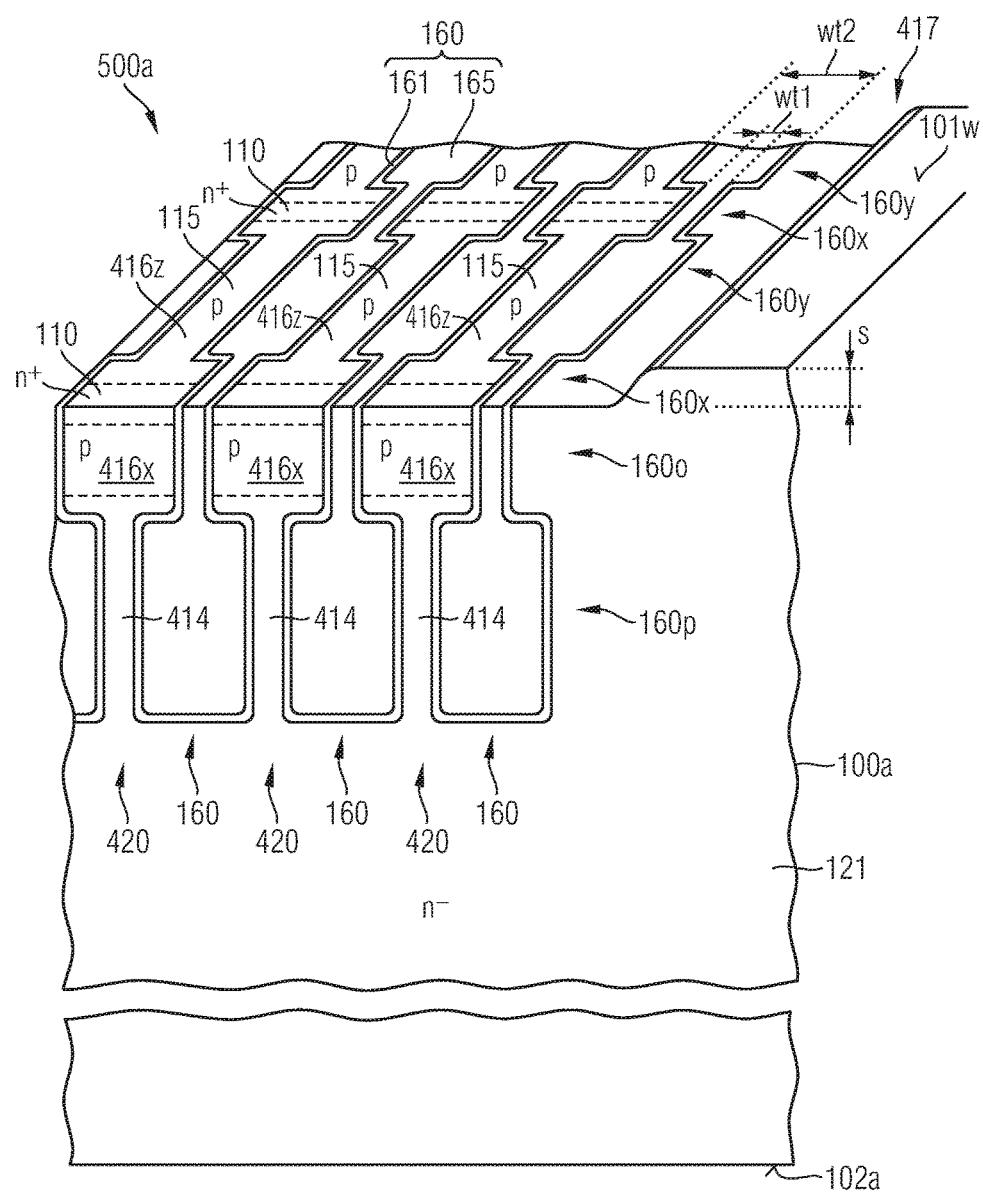
FIG. 8B is a schematic perspective view of the semiconductor substrate portion of FIG. 8A after forming control structures.

As illustrated in FIG. 8B, the control structures 160 narrow portions of the semiconductor mesas 420 in the narrow second mesa sections 416z including portions of the body zones 115 separating isolated source zones 110 from each other. Top portions 160o of the control structures 160 include first top portions 160x having a first top width wt1 and second top portions 160y having a second top width wt2 greater than the first top width wt1. The first and second top portions 160x, 160y directly adjoin to each other and alternate along the horizontal longitudinal extension of the respective top portion 160a. The source zones 110 may be formed within the wide second mesa sections 416x sandwiched between opposing first top portions 160a of the two neighboring control structures 160, respectively.

In FIG. 9A the narrow second mesa sections 416z include constrictions sufficiently narrow such that the narrowed second mesa sections are completely through-oxidized at the constrictions during formation of the control dielectric 161 as illustrated in FIG. 9B.

Figure 10A:
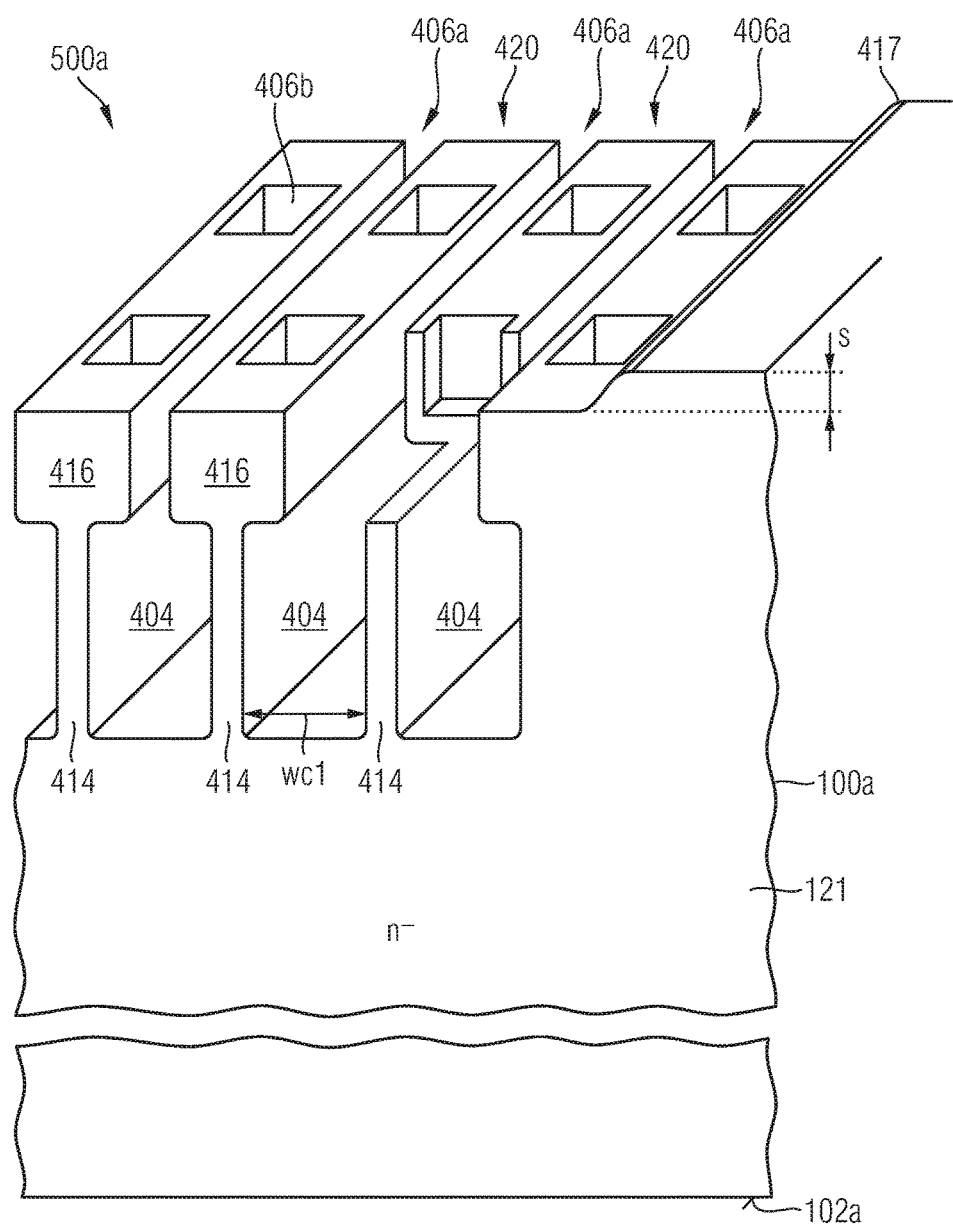
FIG. 10A is a schematic perspective view of a portion of a semiconductor substrate for illustrating a further method of patterning semiconductor mesas along longitudinal axes after forming second trenches including stripe and hole trenches.

According to FIG. 10A the second trenches 406 include stripe trenches 406a and hole trenches 406b, which may be contemporaneously formed in the same patterning process. The stripe trenches 406a run parallel to the first trenches 404 and may expose some or all of them. The hole trenches 406b extend from the first surface 101a of the semiconductor substrate 500a into the second mesas 416. A width of the hole trenches 406b may be selected such that in a following oxidation step semiconductor fins between the hole trenches 406b and the stripe trenches 406a are completely through oxidized. According to other embodiments, the width of the hole trenches 406b is selected such that in the finalized device narrow semiconductor fins remain between structures resulting from a fill of the hole trenches 406b and structures resulting from a fill of the stripe trenches 406a. A vertical extension of the hole trenches 406b is smaller than a vertical extension of the stripe trenches 406a. Control structures 160 are formed in and along the stripe and hole trenches 406a, 406b of FIG. 10A.

Figure 10B:
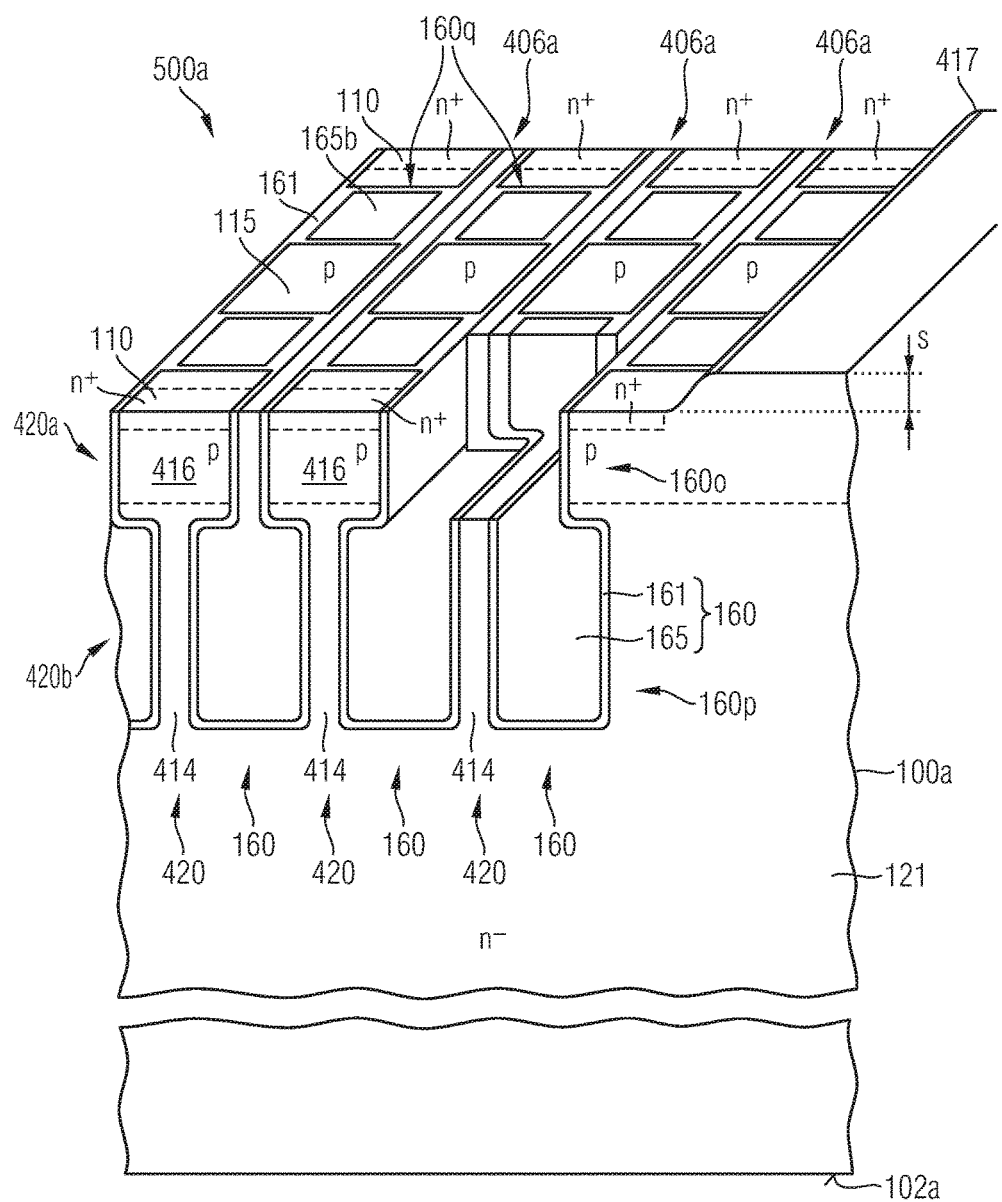
FIG. 10B is a schematic perspective view of the semiconductor substrate portion of FIG. 10A after forming control structures.

FIG. 10B shows the control structures 160 including top portions 160o in the stripe trenches 406a of FIG. 10A and intermediate portions 160q in the hole trenches 406b of FIG. 10A. The top and intermediate portions 160o, 106q may directly adjoin to each other such that the top portions 160o separate upper portions of the second mesas 416, respectively. According to other embodiments, narrow semiconductor fins may separate the intermediate portions 160q from the top portions 160o of the control structures 160. A vertical extension of the intermediate portions 160q is smaller than a vertical extension of the top portions 160o. The intermediate portions 160q may include the same materials and may have the same layer configuration as the top portions 160o. A conductive material of the intermediate portions 160q may float or may be electrically connected to a conductive material of one of the top portions 160o. The intermediate portions 160q effectively reduce a lateral conductivity in the top sections 420a of the semiconductor mesas 420. An effective width of the top sections 420a varies along the longitudinal axis of the concerned semiconductor mesa 420.

Figure 10C:
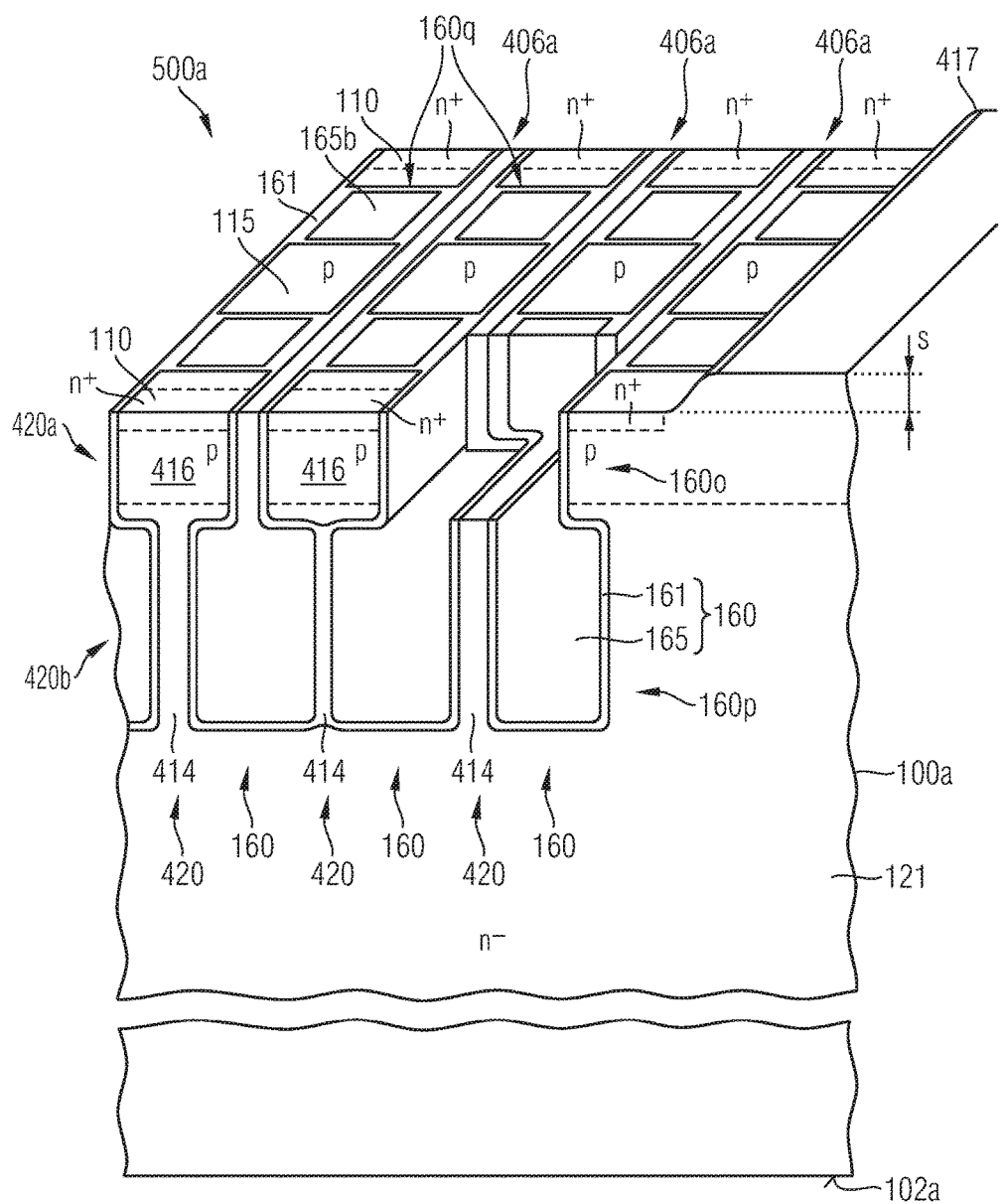
FIG. 10C is a schematic perspective view of a portion of a semiconductor device including a completely insulated semiconductor section in a cell area.

FIG. 10C refers to an embodiment based on a variation of the widths of the bottom portions 160p of the control structures 160 along the longitudinal direction in combination with at least one pair of intermediate portions 160q as described with reference to FIG. 10B.

The widths of the bottom portions 160p of two neighboring control structures 160 are modified such that between a pair of bottom portions 160p instead of a separating strip 414 a pure semiconductor oxide structure 414z separates the bottom portions 160p of the two concerned control structures 160 at least between the pair of intermediate portions 160q. The top section 420a of the concerned semiconductor mesa 420 includes a completely insulated semiconductor section 190. In the semiconductor section 190 one or more semiconductor elements such as a thermal diode, a sense transistor, etc. The mode of operation of semiconductor elements formed in the semiconductor section 190 is completely unaffected from the operation mode and operation conditions of transistor cells formed in the semiconductor mesas 420.

Figure 11A:
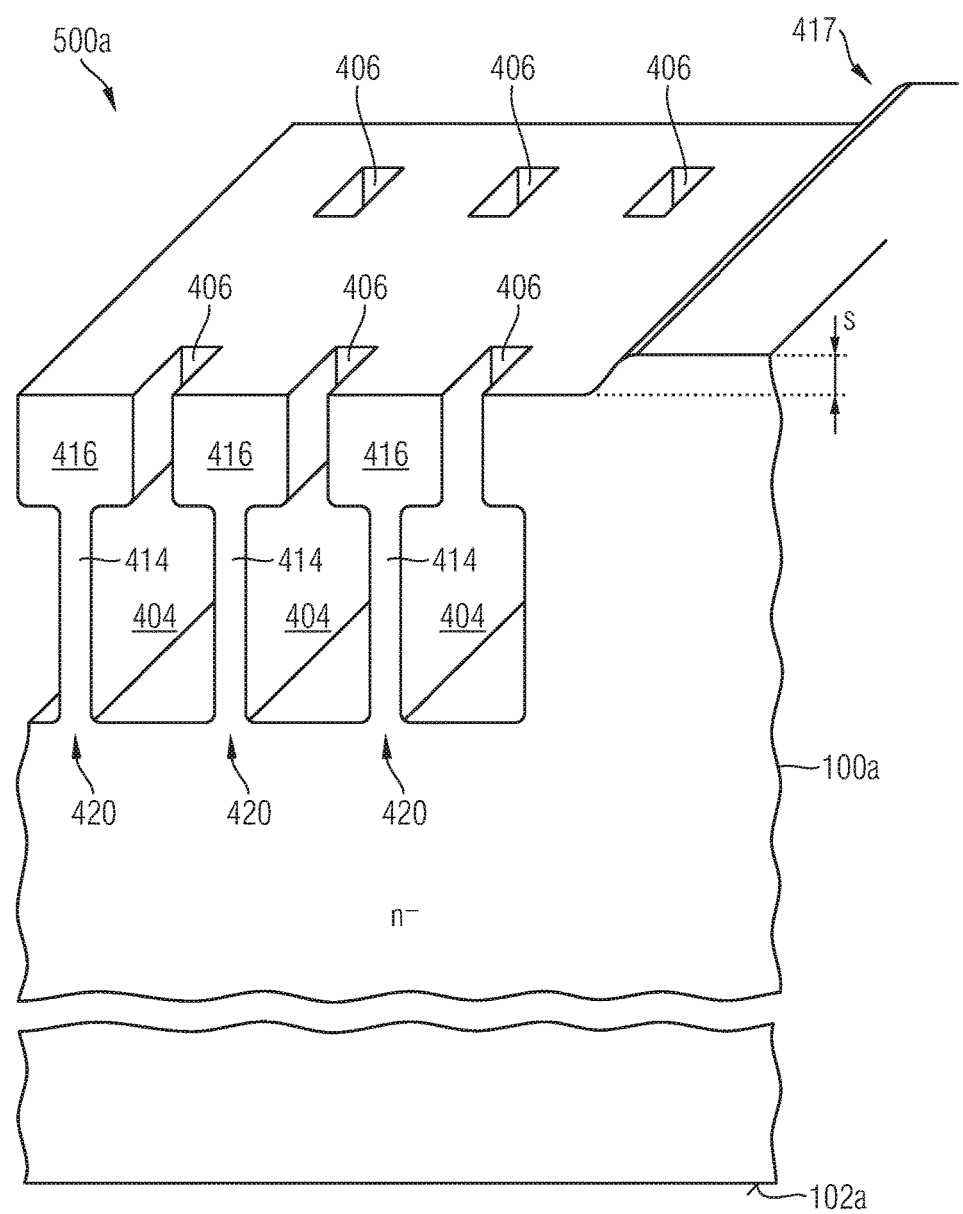
FIG. 11A is a schematic perspective view of a semiconductor substrate portion for illustrating a method of manufacturing semiconductor devices according to an embodiment related to isolated second trenches along longitudinal axes of the semiconductor mesas after forming the second trenches.

According to the embodiment illustrated in FIG. 11A lines of isolated second trenches 406 are assigned to the same cavity 404, respectively.

Figure 11B:
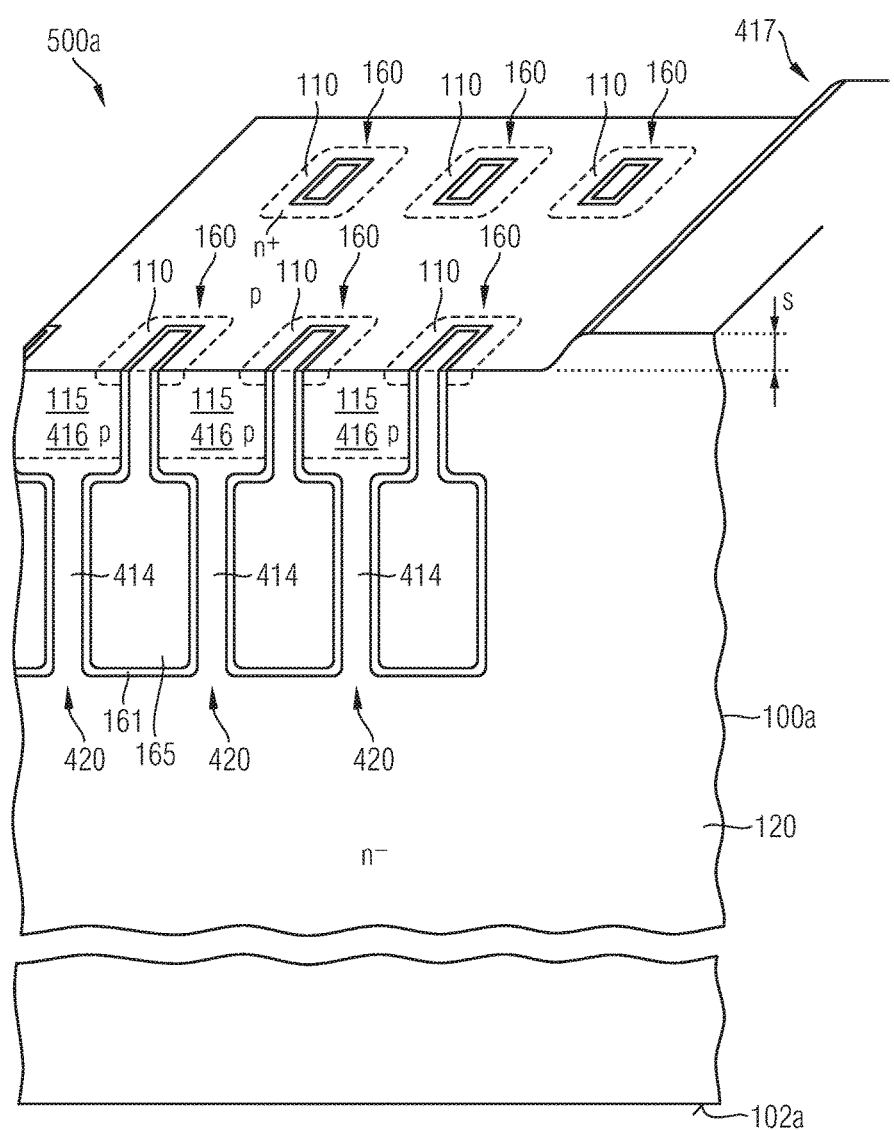
FIG. 11B is a schematic perspective view of the semiconductor substrate portion of FIG. 11A after forming control structures.

FIG. 11B illustrates the resulting control structures 150 embedded in second mesas 416 connected to each other.

In the preceding embodiments the shape of the second trenches 406 does not completely reproduce the shape of the cavities 404. The second trenches 406 are designed to supply sufficient material and process fluids into the cavities 404 for reliable formation of the control dielectric 161 and the control electrode 165.

Figure 12:
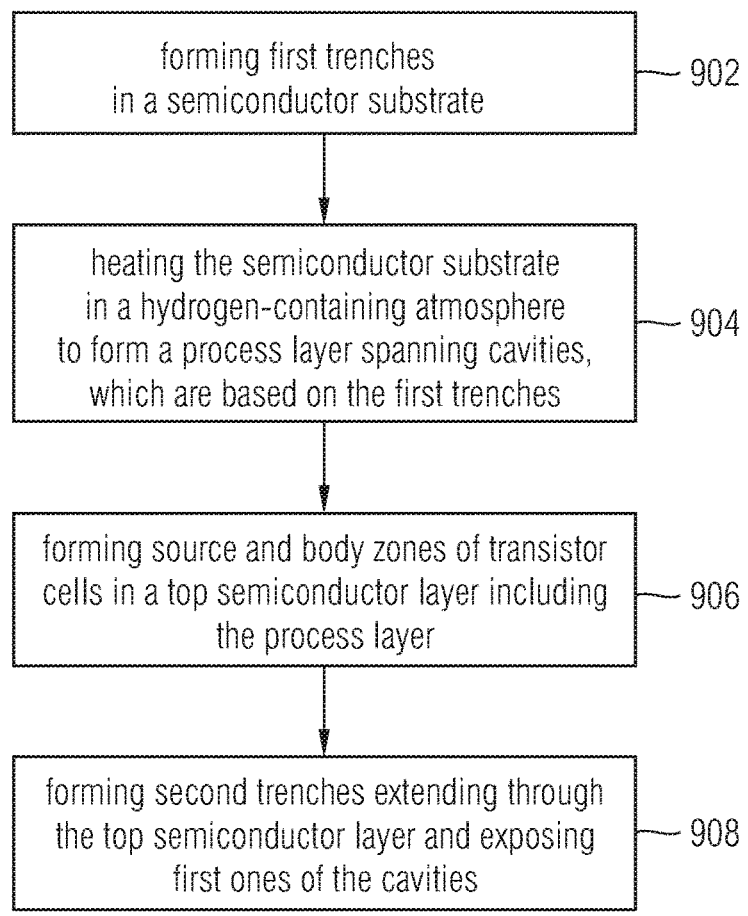
FIG. 12 is a simplified flowchart of a method of manufacturing a semiconductor device according to a further embodiment.

FIG. 12 summarizes a method of manufacturing a semiconductor device according to the embodiments. First trenches are formed that extend from a process surface into a semiconductor substrate, which is provided from a semiconductor material (902). The semiconductor substrate is heated in a hydrogen-containing ambient, wherein a portion of the semiconductor material at the process surface fluidifies and forms a contiguous process layer spanning cavities based on the first trenches (904). Source and body zones of transistor cells are formed in a top semiconductor layer including at least the process layer (906). Before or after forming the source and/or body zones, second trenches are formed that extend through the top semiconductor layer and that expose at least first ones of the cavities (908).

Figure 13A:
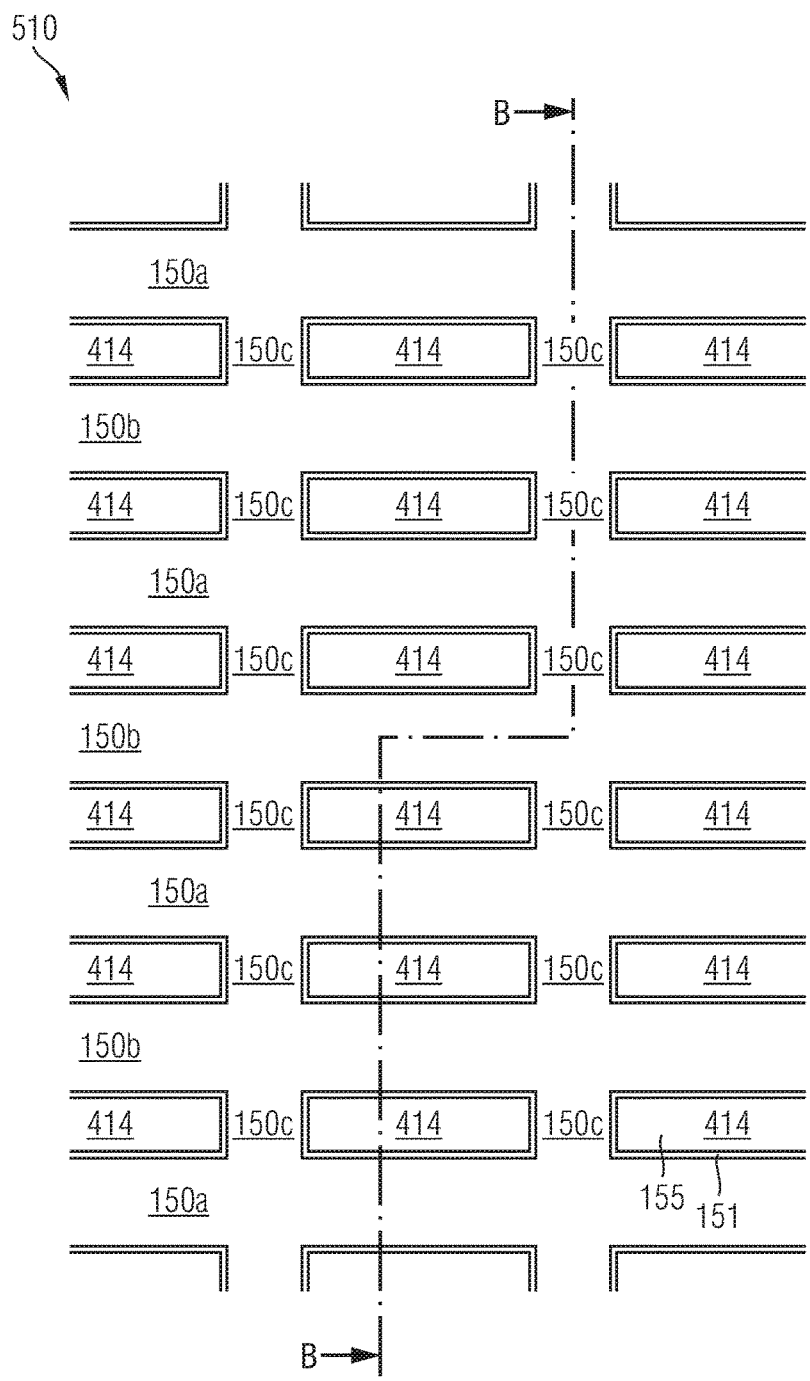
FIG. 13A is a schematic horizontal cross-sectional view of a portion of a semiconductor device according to an embodiment providing buried control structure portions for IGFETs (insulated gate field effect transistors) and semiconductor diodes.

FIGS. 13A and 13B refer to a semiconductor device 510 whose pedestal layer 130 has the same conductivity type as a drift zone 121. The semiconductor device 510 may be an IGFET (insulated gate field effect transistor) or a desaturable semiconductor diode.

A single-crystalline semiconductor material, for example silicon (Si), silicon carbide (SiC), germanium (Ge), a silicon germanium crystal (SiGe), gallium nitride (GaN), or another $A_{III}B_V$ semiconductor forms a semiconductor body 100 with a first surface 101, which may be approximately planar or which may be defined by a plane spanned by coplanar surface sections, as well as a planar second surface 102 parallel to the first surface 101.

A minimum distance between the first and second surfaces 101, 102 depends on a voltage blocking capability the semiconductor device 500 is specified for. For example, the distance between the first and second surfaces 101, 102 may be in a range from 90 µm to 120 µm for a semiconductor device specified for a blocking voltage of about 1200 V. Other embodiments related to semiconductor devices with higher blocking capabilities may provide semiconductor bodies 100 with a thickness of several 100 µm. Semiconductor devices with low blocking capabilities may have a thickness from 35 µm to 90 µm.

In a plane parallel to the first surface 101 the semiconductor body 100 may have a rectangular shape with an edge length in the range of several millimeters. A normal to the first surface 101 defines a vertical direction and directions orthogonal to the vertical direction are horizontal directions.

The semiconductor body 100 includes a base region 120 with a drift zone 121 of a first conductivity type. A dopant concentration in the drift zone 121 may gradually or in steps increase or decrease with increasing distance to the first surface 101 at least in portions of its vertical extension. According to other embodiments the dopant concentration in the drift zone 121 may be approximately uniform. A mean dopant concentration in the drift zone 121 may be between 5 E12 $cm^{-3}$ and 1 E15 $cm^{-3}$, for example from 1 E13 $cm^{-3}$ to 1 E14 $cm^{-3}$. In case the semiconductor device 510 is based on SiC, a mean impurity concentration in the drift zone 121 may be between 5 E14 $cm^{-3}$ and 1 E17 $cm^{-3}$, e.g., in a range from 1 E15 $cm^{-3}$ to 1 E16 $cm^{-3}$.

The base region 120 may further include a field stop layer 128 of the first conductivity type between the drift zone 121 and the second surface 102. A mean net impurity concentration in the field stop layer 128 may exceed the mean net impurity concentration in the drift zone 121 by at least one order of magnitude. The base region 120 may include further doped zones, for example, zones forming a compensation structure, barrier zones for locally increasing a charge carrier plasma density and/or buffer layers.

A pedestal layer 130 is sandwiched between the base region 120 and the second surface 102. The pedestal layer 130 directly adjoins the second surface 102 and may directly adjoin the drift zone 121 or, if applicable, the field stop layer 128, by way of example.

In the illustrated embodiment referring to IGFETs and desaturable semiconductor diodes, the pedestal layer 130 is a contiguous layer of the first conductivity type. A dopant concentration in the pedestal layer 130 is sufficiently high to form an ohmic contact with a metal directly adjoining the second surface 102. In case the semiconductor body 100 is based on silicon (Si), a maximum dopant concentration for an n-type emitter layer 130 may be at least 1 E18 cm$^{-3}$, for example at least 6 E19 cm$^{-3}$.

Control structures including gate structures 150 are formed in a portion of the semiconductor body 100 oriented to the first surface 101. The gate structures 150 include first portions 150a extending from the first surface 101 into the drift zone 121 up to a bottom plane BPL parallel to the first surface 101. Second portions 150b are formed between neighboring first portions 150a, wherein in first sections along a longitudinal axis perpendicular to the cross-sectional plane portions of the semiconductor body 100 form separation strips 414 that locally separate neighboring first and second portions 150a, 150b along a horizontal direction. In second sections along the longitudinal axis of the first portions 150a third portions 150c laterally connect the first and second portions 150a, 150b. A distance between the first surface 101 and the bottom plane BPL may range from 1 μm to 30 μm, e.g., from 3 μm to 7 μm. The gate structures 150 may include a conductive gate electrode 155, which may include or consist of a heavily doped polycrystalline layer, a metal-containing layer, or both. The gate electrodes 155 may be electrically coupled or connected to a gate terminal G of the semiconductor device 510.

According to other embodiments the control structures may include further control electrodes electrically insulated from the gate electrodes 155 and electrically connected to a potential different to that of the gate terminal G. A gate dielectric 151 separates the respective gate electrode 155 from the semiconductor body 100 and capacitively couples the gate electrode 155 to adjoining portions of the semiconductor body 100.

The gate structures 150 pattern a section of the drift zone 121 oriented to the first surface 101 such that the drift zone 121 includes a plurality of first drift zone sections 121a in semiconductor mesas 420 formed between neighboring gate structures 150 as well as a contiguous second drift zone section 121b in a portion of the semiconductor body 100 between the bottom plane BPL and the second surface 102. A dielectric structure 205 may electrically insulate the gate electrodes 150 from conductive structures outside the semiconductor body 100.

The semiconductor mesas 420 between the gate structures 150 are formed from portions of the semiconductor body 100 and include second mesas 416 between neighboring first portions 150a of the gate structure 150 as well as the separating strips 414 between neighboring first and second portions 150a, 150b.

In the semiconductor mesas 420 body zones 115 of a second conductivity type opposite to the first conductivity type are formed between the first surface 101 and the first drift zone sections 121a, respectively. The body zones 115 form first pn junctions pn1 with the first drift zone sections 121a. The body zones 115 are electrically connected or coupled to a first load terminal L1 of the semiconductor device 510.

In case the semiconductor device 510 is an IGFET, source zones 110, which may be formed as wells extending from the first surface 101a into the semiconductor body may form second pn junctions pn2 with the body zones 115 and the first load terminal L1 is electrically connected to the source zones 110. In case the semiconductor device 510 is a semiconductor diode, the source zones are absent.

In addition, some of the control electrodes may be electrically connected or coupled to the first load terminal L1. The pedestal layer 130 is electrically connected to a second load terminal L2.

In a portion including the respective first drift zone section 121a the separating strips 414 are effective as constricted sections of the semiconductor mesas 420. A constriction width wc is given by the minimum horizontal width of the first drift zone section 121a parallel to the first surface 101 in the separating strips 414 and is smaller than a corresponding maximum horizontal body width wbz of the body zones 115.

The horizontal body width wbz may be between 100 nm and 3 μm, e.g., 150 nm and 1 μm and the constriction width wc may be at most 50%, for example at most 20% of the horizontal body width wbz. According to an embodiment, the constriction width wc is in the range from 20 nm to 300 nm. For example, the horizontal body width wbz is about 200 nm and the constriction width wc may be in a range from 100 nm to 160 nm.

The constriction drastically increases a difference of emitter efficiency between a first state with no inversion layer formed in the drift zone 121 along the control structures 160 and a second state with inversion layers formed along the control structures 160.

The semiconductor device 510 of FIG. 14 may be an RC-IGBT or a desaturable semiconductor diode.

The pedestal layer 130 includes first zones 131 of the first conductivity type and second zones 132 of the second conductivity type. For desaturable semiconductor diodes the second zones 132 may improve the draining of holes during a reverse recovery mode. For RC-IGBTs the first zones 131 enable the reverse conducting functionality. The dopant concentrations in the first and second zones 131, 132 are sufficiently high to form ohmic contacts with a metal directly adjoining the second surface 102. In case the semiconductor body 100 is based on silicon (Si) a dopant concentration in the second zones 132 may be at least 5 E16 cm$^{-3}$, for example at least 1 E18 cm$^{-3}$. For further details, reference is made to the description of FIGS. 13A and 13B.

FIG. 15 refers to a non-reverse conducting or reverse blocking IGBT 513 with a contiguous pedestal layer 130 of the second conductivity type. The narrow separating strips suppress a leakage of charge carriers from the drift zone 121 to the first load terminal L1 in an on-state of the IGBT 513. As regards further details, reference is made to the description of the semiconductor device 510 in FIGS. 11A and 11B.

The gate dielectrics 151 of the IGBT 513 of FIG. 16A include first sections 151a in bottom sections of the gate structures 150 along the bottom plane BPL and second sections 151b between the first sections 151a and the first surface 101. The first sections 151aa are thicker, e.g., at least twice as thick as the second sections 151b. For example, a first thickness of the first sections 151a is about 100 nm to 500 nm and a second thickness of the second sections 151b is about 50 nm to 200 nm. The thick first sections 151a may reduce a capacitive coupling between the gate electrodes 150 and the drift zone 121.

Figure 16B:
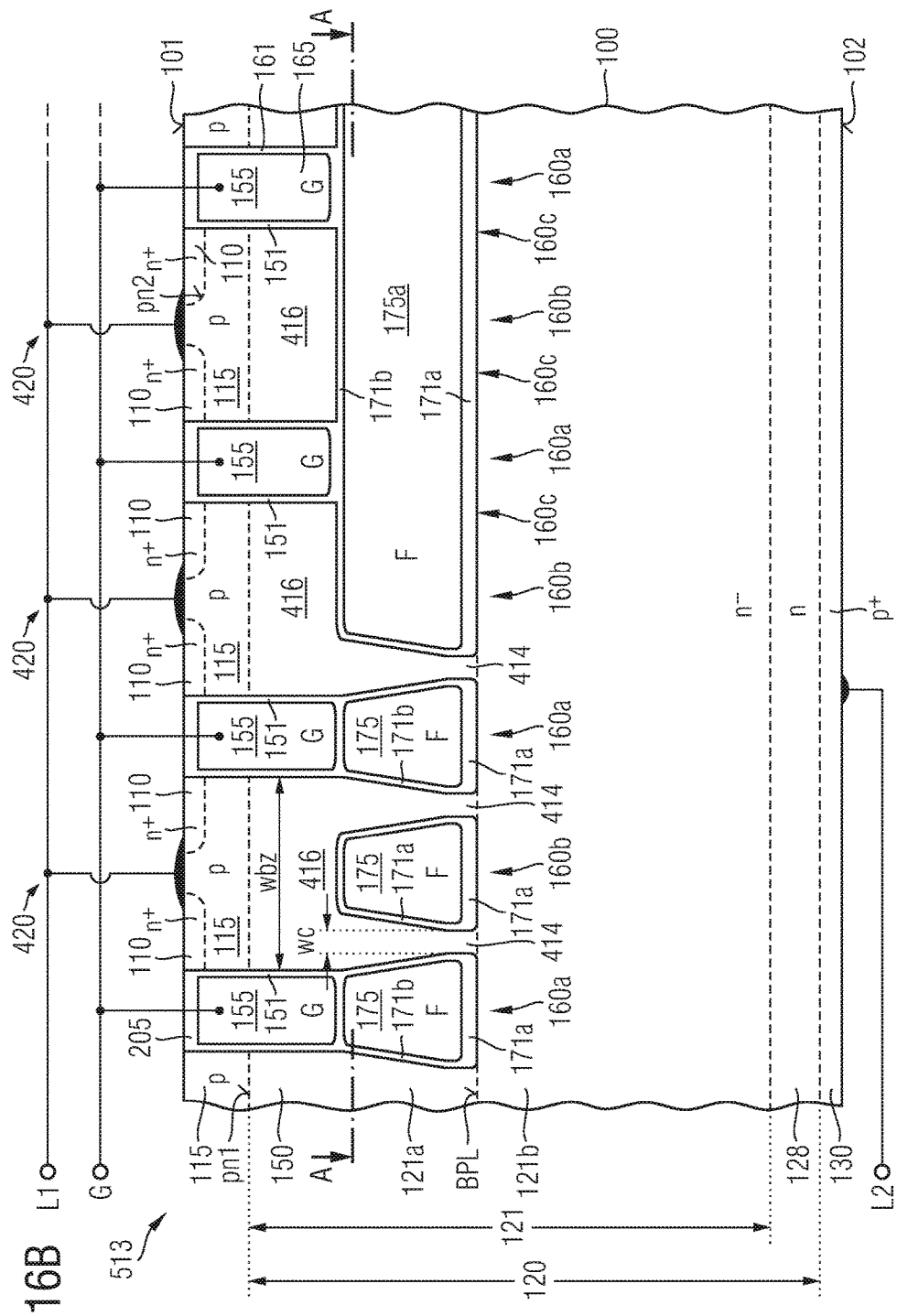
FIG. 16B is a schematic vertical cross-sectional view of a portion of a semiconductor device according to an embodiment referring to IGBTs whose control structures include gate and field electrodes.

The control structures 160 of the IGBT 513 in FIG. 16B include field electrodes 175 in portions oriented to the bottom plane BPL and gate electrodes 155 in portions oriented to the first surface 101, wherein the gate electrodes 155 are insulated from the field electrodes 175. According to an embodiment, the field electrodes 175 may fill the second and third portions 160b, 160c and bottom portions of the first portions 160a of the control structures 160. The field electrodes 175 may be electrically coupled of connected with one of the load terminals L1, L2.

The field dielectrics 171 separating the field electrodes 175 from the semiconductor body 100 may include first sections 171a in bottom sections of the control structures 160 along the bottom plane BPL and second sections 171b between the first sections 171a and the gate electrode 155. The first sections 171a are thicker, e.g., at least twice as thick as the second sections 171b.

Figure 16C:
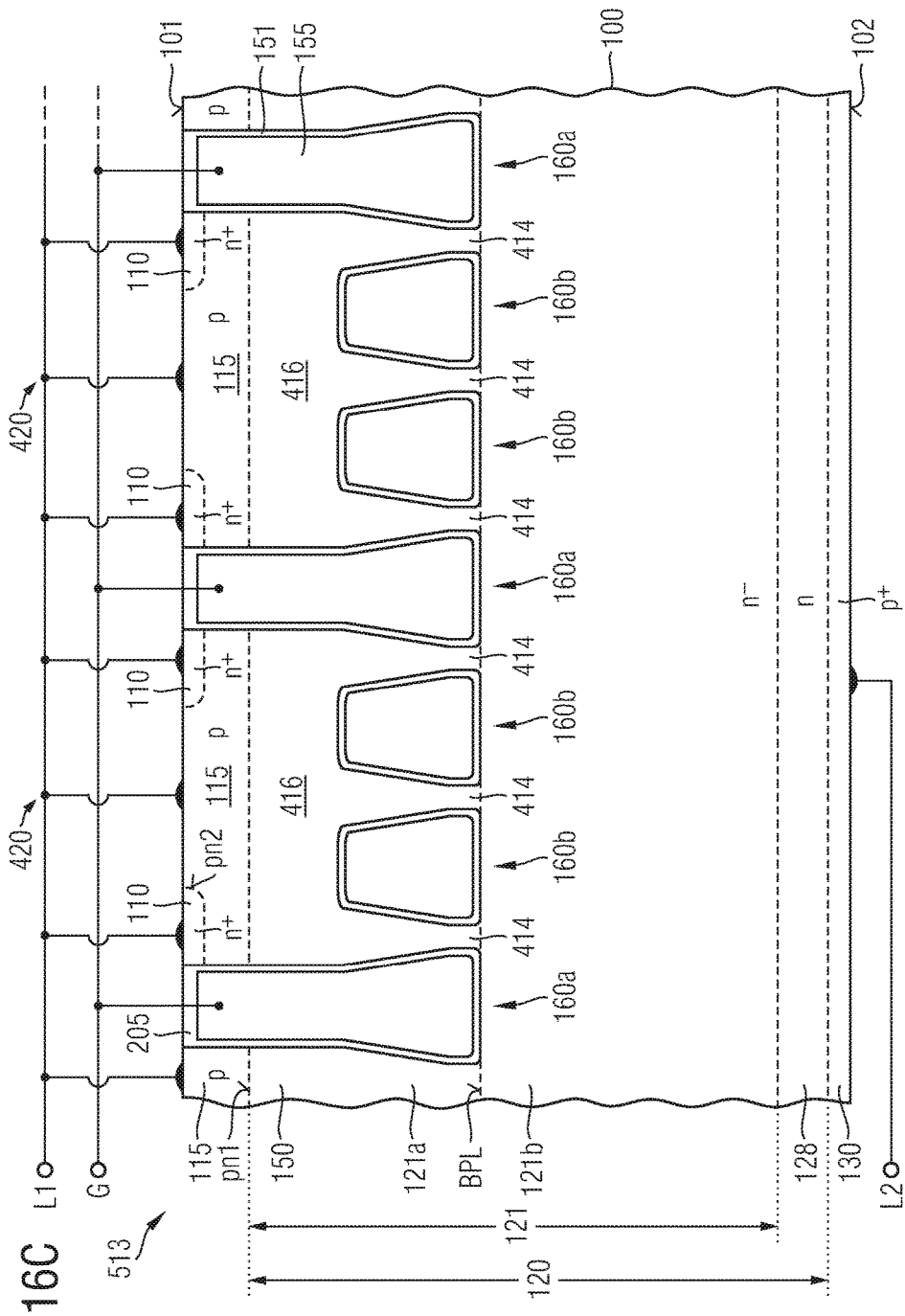
FIG. 16C is a schematic vertical cross-sectional view of a portion of a semiconductor device according to an embodiment referring to IGBTs with a modification of the number of separation strips per semiconductor mesa.

The semiconductor mesas 420 of the IGBT 513 in FIG. 16C include second mesas 416 and three separating strips 414 connected to the same second mesa 416. Further embodiments may provide more than three separating strips 414 per semiconductor mesa 420.

FIG. 16D refers to a semiconductor switching device 514 with a cell area 691 including transistor cells TC and a completely insulated semiconductor section 190 in an auxiliary circuit area 692. The completely insulated semiconductor section 190 may be formed without additional processes contemporaneously with the transistor cells TC, wherein the distances between the first and second portions 160a, 160b in the auxiliary circuit area 692 are selected to be closer than in the cell area 691 such that instead of separating strips 414 completely through-oxidized semiconductor oxide structures 414z are formed between the first and second portions 160a, 160b. The semiconductor section 190 may include sense circuits, driver circuits and/or logic circuits, by way of example.

In the auxiliary circuit area 692, the control structures 160 may be left without fill, maybe filled at least partially with dielectric material, with intrinsic semiconductor material or with a conductive material, which may float or which may be electrically connected or coupled to one of the load terminals L1, L2 or the gate terminal G.

Figure 17A:
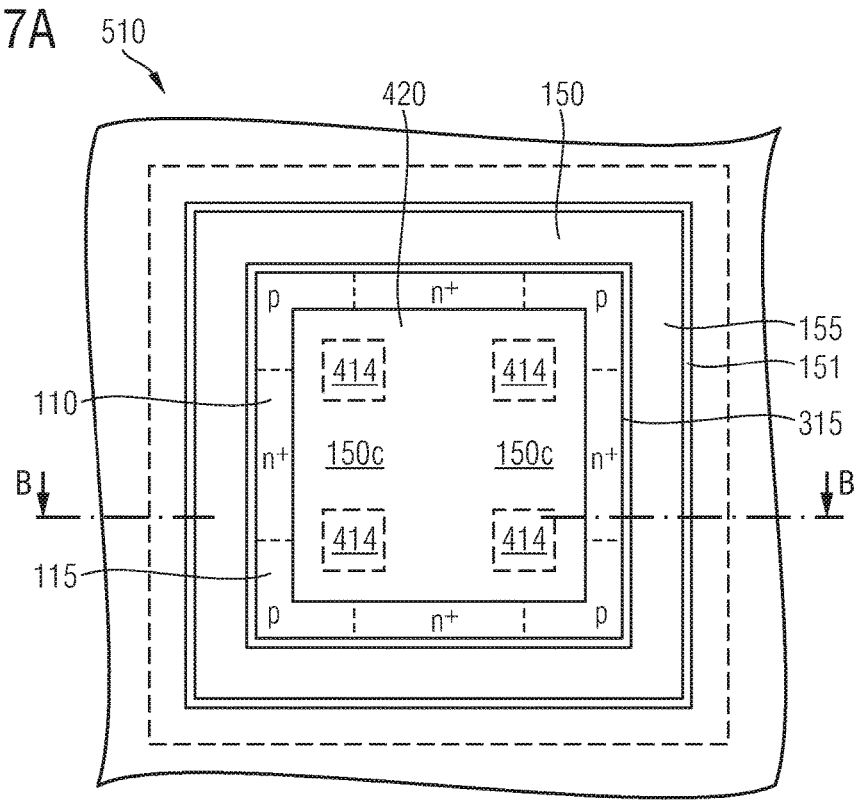
FIG. 17A is a schematic horizontal cross-sectional view of a portion of a semiconductor device according to an embodiment providing buried control structure portions for semiconductor devices with short semiconductor mesas.
Figure 17B:
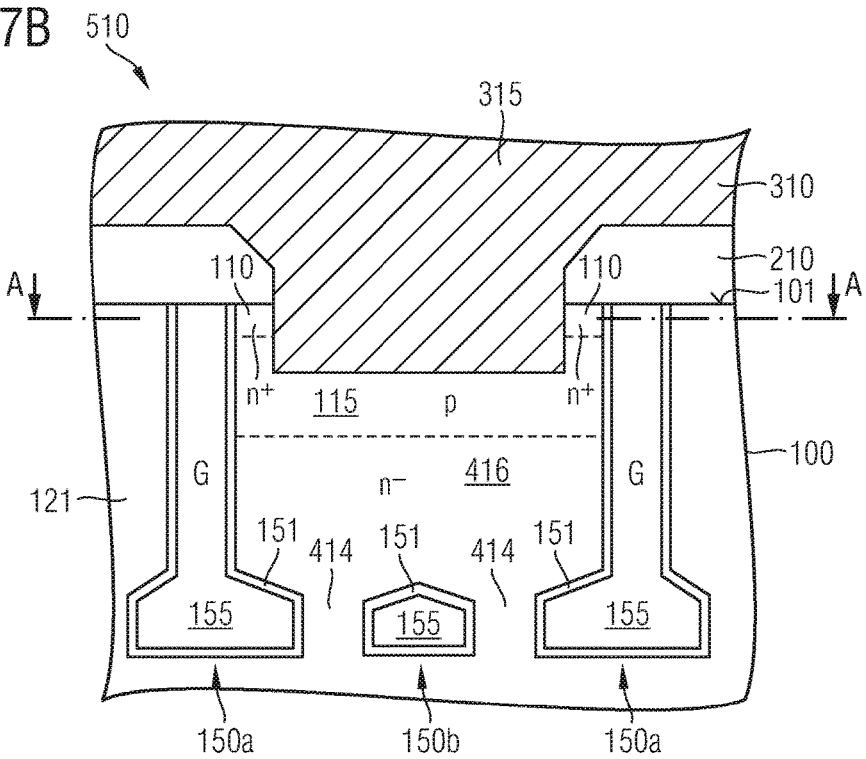
FIG. 17B is a schematic vertical cross-sectional view of the semiconductor device portion of FIG. 17A along line B-B.

FIGS. 17A and 17B refer to semiconductor devices 500 with short semiconductor mesas 420 and ring-shaped gate structures 150 surrounding the semiconductor mesas 420 on four horizontal sides, respectively.

The semiconductor mesa 420 may include a second mesa 416 between the first surface 101 and buried second and third portions 150b, 150c of the gate structure 150. The semiconductor mesa 420 further includes four or more separation strips 414 which may be symmetrically arranged with respect to a horizontal center point of the semiconductor mesa 420. The semiconductor mesa 420 may be defined between two pairs of opposite, straight gate structures 150 forming a ring around the semiconductor mesa. The horizontal cross-sectional area of the second mesa 416 may be a circle, an ellipse, a polygon, e.g., a rectangle or a square with or without rounded corners. The semiconductor device 510 may include a plurality of identical or approximately identical semiconductor mesas 420.

Figure 18:
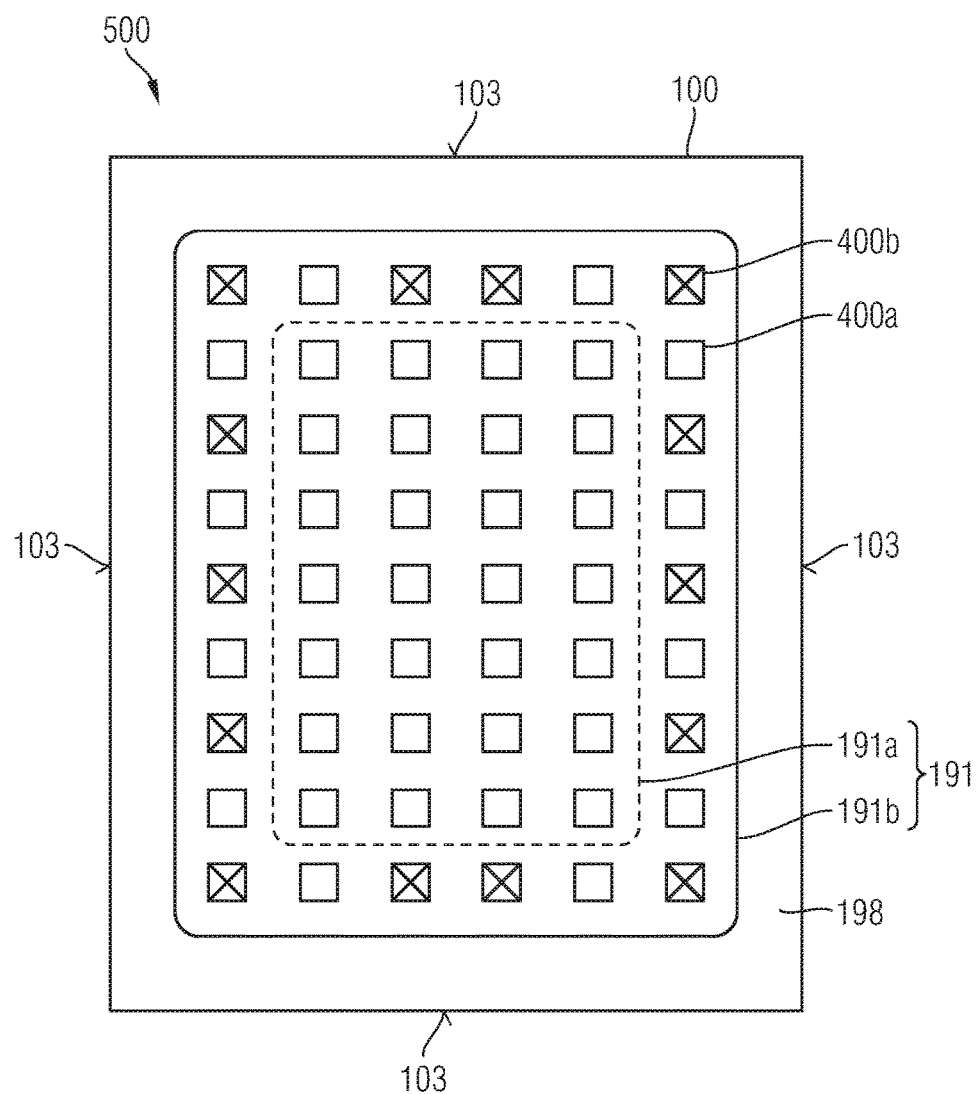
FIG. 18 is a schematic horizontal cross-sectional view of a semiconductor device according to an embodiment concerning a modification of the constricted mesa sections in the vicinity of an edge termination area.

FIG. 18 refers to an embodiment wherein a width of semiconductor mesas and/or density of semiconductor mesas with different widths vary as a function of a distance between the concerned semiconductor mesa and an edge termination area 198.

The semiconductor device 500 of FIG. 18 includes narrow first constricted sections 400a having a first minimum width, respectively and second constricted sections 400b with second minimum widths, which are greater than the first minimum width. In portions of the semiconductor device 500 including the narrow first constricted sections 400a the on-state plasma density is higher than in portions including the second constricted sections 400b.

The first constricted sections 400a may dominate in a central portion 191a of an active area 191 of the semiconductor body 100 including transistor cells. The second constricted sections 400b may be arranged at a higher density in a transition portion 191b of the active area 191 between the central portion 191a and an edge termination area 198 without transistor cells between the active area 191 and a lateral surface 103, which connects the first and second surfaces, or in portions of the active area 191 in whose vertical projection gate pads and gate connections are arranged. Less charge carriers flood the edge termination area 198 during an on-state and less charge carriers have to be removed from the edge termination area 198 when the semiconductor device 500 is switched off. The locally reduced charge carrier plasma density along the edge termination area 198 reduces commutation losses and improves turn-off ruggedness of the semiconductor device 500.

Figure 19A:
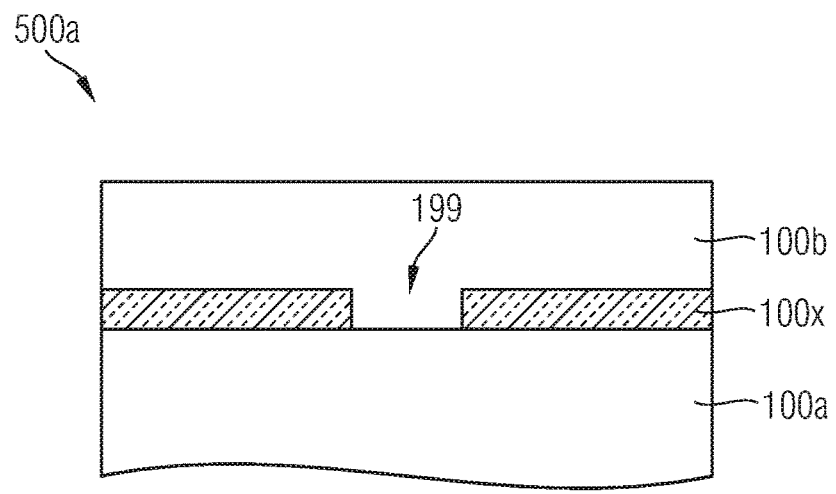
FIG. 19A is a schematic cross-sectional view of a portion of a semiconductor substrate for illustrating a method of manufacturing a semiconductor device according to an embodiment concerning the formation of a buried dielectric structure.
Figure 19B:
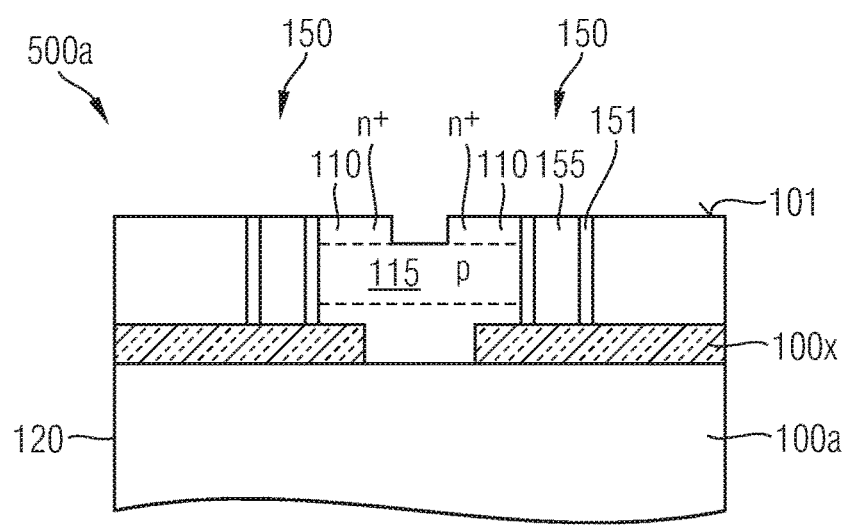
FIG. 19B is a schematic cross-sectional view of the semiconductor substrate portion of FIG. 19A after forming control structures.

FIGS. 19A and 19B refer to a further embodiment concerning the formation of semiconductor mesas with constricted sections.

A dielectric layer 100x is formed on a surface of a base substrate 100a and an opening 199 is formed in the dielectric layer 100x, e.g., by using a patterned hard mask. An epitaxial layer 100b having a thickness of at least 2 µm, e.g. 5 µm, is grown, wherein the crystal lattice of the epitaxial layer 100b locks into that of the exposed portions of the base substrate 100a as shown in FIG. 19A. The lateral growth may be improved by a laser-assisted epitaxial lateral overgrowth and/or by a thermal treatment in a hydrogen atmosphere.

In a portion of the epitaxial layer 100b in the vertical projection of the opening 199 source and body zones 110, 115 of transistor cells with vertical channels may be formed by introducing the suitable dopants. Control structures 150 may be formed in trenches that extend from the first surface 101 of the semiconductor substrate 500a including the base substrate 100a and the epitaxial layer 100b down to the buried dielectric layer 100x. The vertical extensions of the gate structures 150 as well as that of constricted portions of the drift zone 120 in the openings 199 are well defined and exhibit high uniformity across the semiconductor substrate 500a.

Another embodiment refers to a semiconductor device including transistor cells that include source zones of a first conductivity type and body zones of a second conductivity type, wherein the source and body zones are formed in a semiconductor mesa formed from a portion of a semiconductor body. The semiconductor device further includes a control structure that includes top portions arranged on two opposing sides of the semiconductor mesa and extending from a first surface into the semiconductor body, and bottom portions in a distance to the first surface, wherein each bottom portion is connected to the top portions arranged along the same line and along a horizontal longitudinal extension variations of a width of the bottom portion are independent from variations of a width of the top portion.

According to an embodiment, the top portions may be isolated from each other and are arranged along two parallel lines on two opposing sides of the semiconductor mesa.

According to an embodiment, each top portion may include first top portions having a first width and second top portions having a second width greater than the first width, the first and second top portions directly adjoining to each other and alternating along the horizontal longitudinal extension of the respective top portion.

According to a further embodiment, the source zones may be formed in portions of the semiconductor mesa between opposing first top portions of the two control structures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
transistor cells including source zones of a first conductivity type and body zones of a second conductivity type, wherein the source and body zones are formed in a semiconductor mesa formed from a portion of a semiconductor body; and
control structures that comprise first portions extending from a first surface into the semiconductor body on at least two opposing sides of the semiconductor mesa, second portions between the first portions and separated from the first surface by portions of the semiconductor mesa, and third portions connecting the first and the second portions and separated from the first surface by portions of the semiconductor mesa, wherein constricted sections of the semiconductor mesa separate third portions neighboring each other along a horizontal longitudinal extension of the semiconductor mesa.

2. The semiconductor device of claim 1, wherein the first, second, and third portions are aligned to a bottom plane at a first distance to the first surface.

3. The semiconductor device of claim 1, wherein the control structures comprise at least a first control electrode and a first control dielectric separating the first control electrode from the semiconductor body.

4. The semiconductor device of claim 3, wherein the control dielectric has a first section with a first thickness in a bottom portion averted from the first surface and a second section with a second thickness smaller than the first thickness between the first section and the first surface.

5. The semiconductor device of claim 1, wherein the control structures comprise fourth portions extending into the semiconductor body on further two opposing sides of the semiconductor mesa.

6. The semiconductor device of claim 1, wherein the control structure includes a first control electrode in the second portions, the third portions, and in a bottom section of the first portions, and a second control electrode dielectrically separated from the first control electrode in a top section of the first portion between the first surface and the bottom section.

7. The semiconductor device of claim 1, wherein the semiconductor mesa further comprises further constricted sections between neighboring ones of the second portions.

8. The semiconductor device of claim 1, wherein a width and/or density of the constricted sections varies as a function of a distance between the concerned constricted section and an edge area of the semiconductor body, wherein the edge area is devoid of transistor cells and surrounds a cell field including the transistor cells.

9. A semiconductor device, comprising:
transistor cells comprising source zones of a first conductivity type and body zones of a second conductivity type, wherein the source and body zones are formed in a semiconductor mesa formed from a portion of a semiconductor body; and
control structures that comprise top portions arranged on two opposing sides of a top section of the semiconductor mesa and extending from a first surface into the semiconductor body, and bottom portions in a distance to the first surface on opposing sides of a bottom section of the semiconductor mesa, wherein the bottom section of the semiconductor mesa is connected to the top section, wherein at least one of the top and bottom sections comprises a variation of an effective width along a horizontal longitudinal extension of the semiconductor mesa and wherein, in case both the top and the bottom sections comprise a variation of an effective width along the horizontal longitudinal extension of the semiconductor mesa variations of an effective width of the bottom section and variations of an effective width of the top section are not geometrically similar.

10. The semiconductor device of claim 9, wherein the bottom portions of the control structures are isolated from each other and are arranged along two parallel lines.

11. The semiconductor device of claim 9, wherein at least one of the top portions of the control structure includes first top portions having a first top width and second top portions having a second top width greater than the first width, the first and second top portions directly adjoining to each other and alternating along the horizontal longitudinal extension of the semiconductor mesa.

12. The semiconductor device of claim 11, wherein the source zones are formed in portions of the semiconductor mesa between opposing first top portions of the two control structures.

13. The semiconductor device of claim 9, wherein the control structure comprises intermediate portions arranged between the top portions and spaced from the top portions of the control structure, a vertical extension of the intermediate portions being smaller than a vertical extension of the top portions of the control structure.

14. The semiconductor device of claim 9, wherein a distance between the top portions of neighboring ones of the control structures is greater than a distance between the bottom portions of neighboring ones of the control structures.

* * * * *